United States Patent
Miyauchi et al.

(10) Patent No.: US 9,712,038 B2
(45) Date of Patent: Jul. 18, 2017

(54) INSULATED POWER SUPPLY APPARATUS APPLIED TO POWER CONVERTER CIRCUIT INCLUDING SERIES CONNECTIONS OF UPPER AND LOWER ARM SWITCHING ELEMENTS

(71) Applicant: DENSO CORPORATION, Kariya, Aichi-pref. (JP)

(72) Inventors: Syun Miyauchi, Chiryu (JP); Tsuneo Maebara, Nagoya (JP); Yusuke Shindo, Nagoya (JP); Junichi Fukuta, Kuwana (JP)

(73) Assignee: DENSO CORPORATION, Kariya (JP)

( * ) Notice: Subject to any disclaimer, the term of this patent is extended or adjusted under 35 U.S.C. 154(b) by 144 days.

(21) Appl. No.: 14/495,240

(22) Filed: Sep. 24, 2014

(65) Prior Publication Data
US 2015/0085538 A1 Mar. 26, 2015

(30) Foreign Application Priority Data
Sep. 24, 2013 (JP) .................................. 2013-196831

(51) Int. Cl.
H02M 1/084 (2006.01)
H01F 30/10 (2006.01)
(Continued)

(52) U.S. Cl.
CPC .......... *H02M 1/084* (2013.01); *H01F 30/10* (2013.01); *H02M 3/33523* (2013.01); *H02M 2001/0006* (2013.01); *H03K 17/691* (2013.01)

(58) Field of Classification Search
CPC ......... H02M 1/084; H02M 2001/0006; H02M 3/33523; H01F 30/10; H03K 17/691
USPC ................... 363/21.12–21.18, 144, 146, 147
See application file for complete search history.

(56) References Cited

U.S. PATENT DOCUMENTS 8,093,852 B2 * 1/2012 Nakamura .......... B60L 11/1868
  318/471
8,284,575 B2 * 10/2012 Inamura .................. H02M 1/08
  318/800
(Continued)

FOREIGN PATENT DOCUMENTS

JP  11-178356  7/1999
JP  2008-312314  12/2008
(Continued)

OTHER PUBLICATIONS

EIC 2800 STIC search report from John DiGeronimo.*
(Continued)

*Primary Examiner* — Jue Zhang
*Assistant Examiner* — Htet Z Kyaw
(74) *Attorney, Agent, or Firm* — Nixon & Vanderhye PC

(57) ABSTRACT

An insulated power supply apparatus includes an upper arm transformer which has a primary side coil and a secondary side coil, a lower arm transformer which has a primary side coil and a secondary side coil, and a power supply control section which has a voltage control switching element and an integrated circuit which turns on or off the voltage control switching element. At least one of the upper arm transformer and the lower arm transformer is adjacent to the power supply control section when viewing a surface of the substrate from a front thereof. An electric path transfers output voltage of the secondary side coil of the transformer adjacent to the power supply control section, to the integrated circuit. The integrated circuit turns on or off the voltage control switching element to perform feedback control so that the output voltage detected via the electric path reaches a target voltage.

18 Claims, 15 Drawing Sheets

(51) Int. Cl.
    *H02M 3/335* (2006.01)
    *H02M 1/00* (2006.01)
    *H03K 17/691* (2006.01)

(56) References Cited

U.S. PATENT DOCUMENTS

| | | | |
|---|---|---|---|
| 9,602,010 B2* | 3/2017 | Arima | H02M 3/33507 |
| 2011/0292693 A1* | 12/2011 | Niijima | H02M 3/33507 |
| | | | 363/21.17 |
| 2012/0051099 A1* | 3/2012 | Funaba | H02M 1/08 |
| | | | 363/21.17 |
| 2012/0134181 A1* | 5/2012 | Amano | H02M 7/497 |
| | | | 363/21.12 |
| 2013/0039097 A1 | 2/2013 | Watanabe et al. | |
| 2013/0328514 A1* | 12/2013 | Funaba | H02P 27/08 |
| | | | 318/519 |

FOREIGN PATENT DOCUMENTS

| | | |
|---|---|---|
| JP | 2009-038244 | 2/2009 |
| JP | 2013-038971 | 2/2013 |
| JP | 2013-135551 | 7/2013 |

OTHER PUBLICATIONS

Translated foreign patent document JPH 11-178356, Pub. Date Jul. 1999.*
Translated foreign patent document JP201313551, Pub. Date Jul. 2013.*
Translated foreign patent document JP2009038244, Pub. Date Feb. 2009.*
Office Action (3 pages) dated Aug. 4, 2015, issued in corresponding Japanese Application No. 2013-196831 and English translation (3 pages).

* cited by examiner

INSULATED POWER SUPPLY APPARATUS APPLIED TO POWER CONVERTER CIRCUIT INCLUDING SERIES CONNECTIONS OF UPPER AND LOWER ARM SWITCHING ELEMENTS

CROSS-REFERENCE TO RELATED APPLICATION

This application is based on and claims the benefit of priority from earlier Japanese Patent Application No. 2013-196831 filed Sep. 24, 2013, the description of which is incorporated herein by reference.

BACKGROUND

Technical Field

The present invention relates to an insulated power supply apparatus applied to a power converter circuit including a series connection of an upper arm switching element and a lower arm switching element. The apparatus includes an upper arm transformer, which can supply drive voltage from a DC power supply to the upper arm switching element, and a lower arm transformer, which can supply drive voltage from the DC power supply to the lower arm switching element.

Related Art

As disclosed in JP-A-11-178356, an insulated power supply apparatus is known which supplies drive voltage to a switching element (IGBT). Specifically, the power supply apparatus includes a plurality of transformers, a transistor, and a control circuit. The transistor is operated so that electricity is conducted between a DC power supply and primary side coils configuring respective transformers or is intercepted therebetween. The control circuit detects output voltage of a secondary side coil configuring one of the plurality of transformers via an electric path connecting between the output side of the secondary side coil and the control circuit. The control circuit operates the transistor based on the output voltage detected via the electric path.

The plurality of transformers configuring the insulated power supply apparatus, the control circuit, which is an integrated circuit, and the like are mounted on a substrate. Depending on the position of one of the transformers, whose output voltage of the secondary side coil is to be detected, on the substrate, the electric path may be lengthened. In this case, the amount of voltage drop in the electric path may be increased, and noise may be superimposed on a voltage signal transmitted over the electric path. In addition, accuracy in controlling the output voltage of the secondary side coil by the control circuit may be lowered, and the control circuit might malfunction.

Note that, to complement accuracy in controlling the output voltage, it can be considered, for example, that a power circuit (e.g. chopper-type step-up circuit) can be provided between the DC power supply and the primary side coils to increase the accuracy in controlling the voltage applied from the DC power supply to the primary side coils. Note that, when operating the step-up circuit, the step-up circuit produces heat. Hence, a concern rises that the heat may adversely affect electronic components mounted on the substrate.

SUMMARY

An embodiment provides an insulated power supply apparatus which can enhance accuracy in controlling output voltage of a secondary side coil, and can avoid a malfunction of an integrated circuit controlling the output voltage.

As an aspect of the embodiment, an insulated power supply apparatus, which is applied to at least one power converter circuit including at least one series connection of an upper arm switching element and a lower arm switching element, includes: at least one upper arm transformers which has a primary side coil connectable to a DC power supply and a secondary side coil which supplies drive voltage to the upper arm switching element, and which is provided on a substrate; a lower arm transformer which has a primary side coil connectable to the DC power supply and a secondary side coil which supplies drive voltage to the lower arm switching element, and which is provided on the substrate; and at least one power supply control section which has at least one voltage control switching element which is turned on or off to apply voltage of the DC power supply to the primary side coils of the upper arm transformer and the lower arm transformer, and an integrated circuit which turns on or off the voltage control switching element, and which is provided on the substrate. At least one of the upper arm transformer and the lower arm transformer is provided so as to be adjacent to the power supply control section when viewing a surface of the substrate from a front thereof. The apparatus further includes an electric path which transfers output voltage of the secondary side coil of the transformer provided so as to be adjacent to the power supply control section, to the integrated circuit. The integrated circuit turns on or off the voltage control switching element to perform feedback control so that the output voltage detected via the electric path reaches a target voltage.

DETAILED DESCRIPTION OF THE PREFERRED EMBODIMENTS

With reference to the accompanying drawings, hereinafter is described an embodiment of the present invention.

First Embodiment

Hereinafter, the first embodiment is described with reference to drawings. In the first embodiment, an insulated power supply apparatus according to the present invention is applied to a hybrid car including a rotary machine and an engine serving as in-vehicle traction units.

Figure 1:
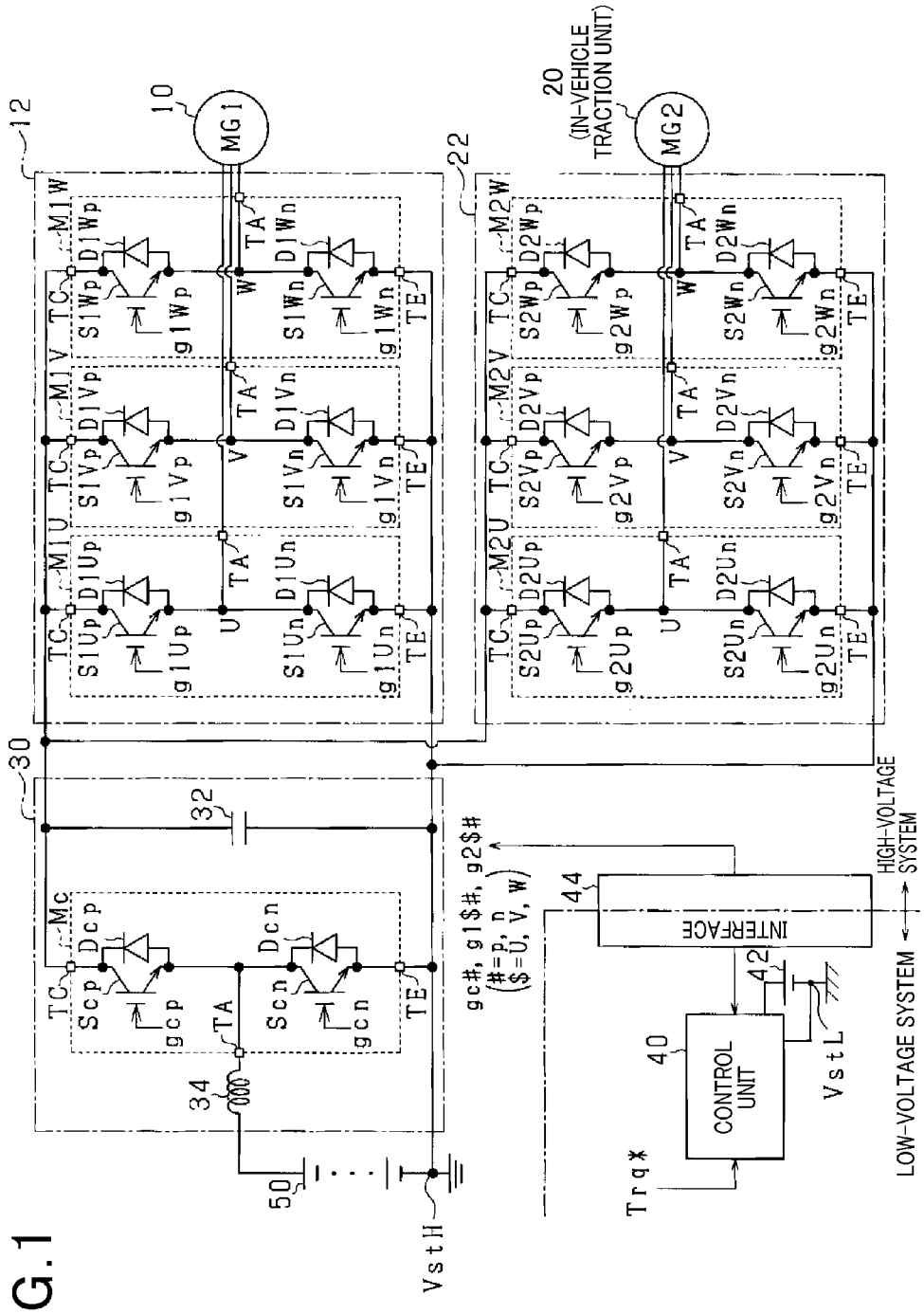
FIG. 1 is a diagram showing a general configuration of a motor control system according to a first embodiment.

As shown in FIG. 1, a motor control system includes a first motor generator 10, a second motor generator 20, a first inverter 12, a second inverter 22, a step-up converter 30, and a control unit 40. The first motor generator 10 and the second motor generator 20 are connected to drive wheels and an engine, which serves as an in-vehicle traction unit, via a power dividing mechanism (not shown). The first motor generator 10 is connected to the first inverter 12. The first motor generator 10 serves as a starter which applies initial rotation to a crankshaft of the engine, a generator supplying electricity to in-vehicle equipment, and the like. The second motor generator 20 is connected to the second inverter 22 and serves as an in-vehicle traction unit and the like. The first inverter 12 and the second inverter 22 are three-phase inverters and are connected to a high-voltage battery 50 (e.g. a lithium-ion secondary battery or a nickel-metal hydride secondary battery). Note that, in the present embodiment, each of the first inverter 12, the second inverter 22, and the step-up converter 30 corresponds to "power converter circuit".

The step-up converter 30 includes a capacitor 32, a reactor 34, an upper arm step-up switching element Scp, and a lower arm step-up switching element Scn. Specifically, the step-up switching elements Scp, Scn are connected in series. The series connection of the upper arm step-up switching element Scp and the lower arm step-up switching element Scn is connected to the capacitor 32 in parallel. The connection point of the series connection is connected to a positive electrode terminal of the high-voltage battery 50 via the reactor 34. The step-up converter 30 has a function of turning on (closing) and turning off (opening) the step-up switching elements Scp, Scn to increase the output voltage (e.g. 288 V) of the high-voltage battery 50 with setting an upper limit to a predetermined voltage (e.g. 650 V).

The first inverter 12 includes three series connections of first $-phase upper arm switching element S1$p ($=U, V, W) and first $-phase lower arm switching element S1$n. The second inverter 22 includes three series connections of second $-phase upper arm switching element S2$p and second $-phase lower arm switching element S2$n.

Note that, in the present embodiment, voltage control type semiconductor switching elements are used as the switching elements Sc#, S1$#, S2$# (#=p, n). More specifically, IGBTs are used. In addition, free wheel diodes Dc#, D1$#, D2$# are connected to the switching elements Sc#, S1$#, S2$# in anti-parallel.

In addition, in the present embodiment, each of the upper arm step-up switching element Scp, the first $-phase upper arm switching elements S1$p, and the second $-phase upper arm switching elements S2$p corresponds to "upper arm switching element". In addition, each of the lower arm step-up switching element Scn, the first $-phase lower arm switching elements S1$n, and the second $-phase lower arm switching elements S2$n corresponds to "lower arm switching element".

The upper arm step-up switching element Scp, the free wheel diode Dcp connected to the switching element Scp in anti-parallel, the lower arm step-up switching element Scn, and the free wheel diode Dcn connected to the switching element Scn in anti-parallel are modularized to configure a step-up module Mc.

In addition, the first $-phase upper arm switching element S1$p, the free wheel diode D1$p connected to the switching element S1$p in anti-parallel, the first $-phase lower arm switching element S1$n, and the free wheel diode D1$n connected to the switching element S1$n in anti-parallel are modularized to configure a first $-phase module M1$.

In addition, the second $-phase upper arm switching element S2$p, the free wheel diode D2$p connected to the switching element S2$p in anti-parallel, the second $-phase lower arm switching element S2$n, and the free wheel diode D2$n connected to the switching element S2$n in anti-parallel are modularized to configure a second $-phase module M2$.

Figure 2:
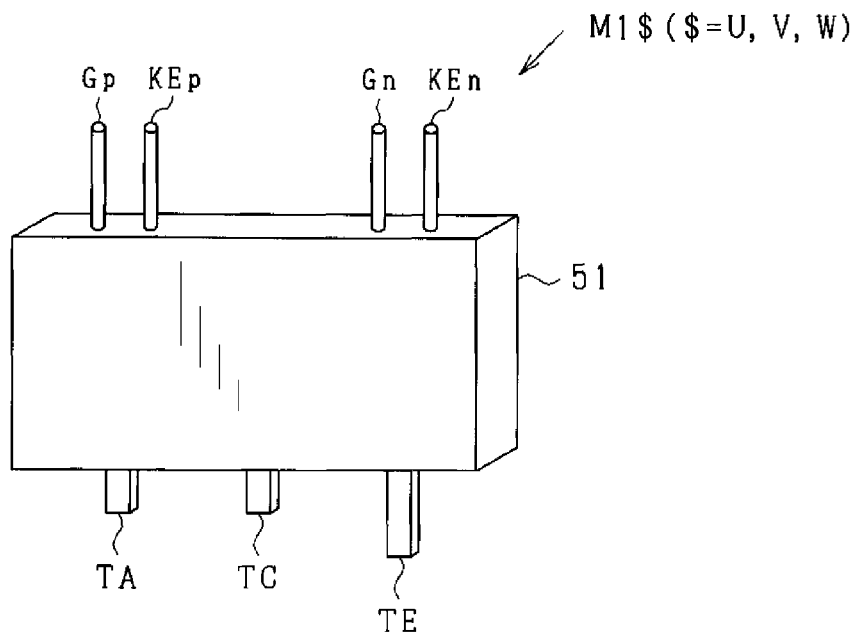
FIG. 2 is a perspective view showing a configuration of a semiconductor module according to the first embodiment.
Figure 3:
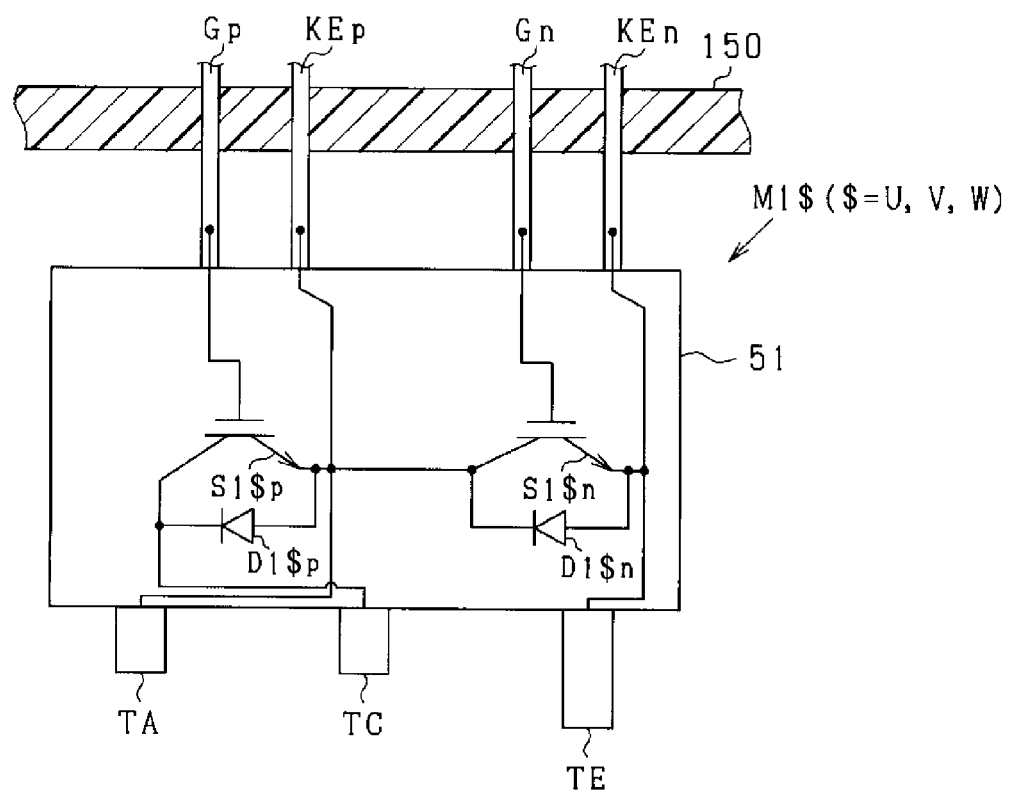
FIG. 3 is a diagram showing an internal configuration of the semiconductor module according to the first embodiment.

Configurations of the above modules are described by taking the first $-phase module M1$ as an example with reference to FIG. 2 and FIG. 3.

The first $-phase module M1$ includes a main body part 51, a plurality of control terminals projecting from the main body part 51, a plurality of power terminals projecting from the main body part 51. The main body part 51 includes the first $-phase upper and lower switching elements S1$p, S1$n and the free wheel diodes D1$p, D1$n. The control terminals include a gate terminal Gp of the first $-phase upper arm switching element S1$p, a Kelvin emitter terminal KEp of the first $-phase upper arm switching element S1$p, a gate terminal Gn of the first $-phase lower arm switching element S1$n, and a Kelvin emitter terminal KEn of the first $-phase lower arm switching element S1$p. The Kelvin emitter terminals KEp, KEn have the same potential as that of the output terminals (emitters) of the switching elements S1$p, S1$n.

In practice, the control terminals include, in addition to the gate terminals Gp, Gn and the Kelvin emitter terminals KEp, KEn, a sensor terminal which outputs a minute current having a correlation with a current (collector current) flowing between the input terminal (collector) and the emitter of the lower arm switching element S1$p, S1$n. Note that, in FIGS. 2 and 3, the sensor terminal and the like are not shown.

The power terminals are a collector terminal TC short-circuited to the collector of the first $-phase upper arm switching element S1$p, an emitter terminal TE short-circuited to the emitter of the first $-phase lower arm switching element S1$n, and a connection terminal TA short-circuited to the connection point of the emitter of the first $-phase upper arm switching element S1$p and the collector of the first $-phase lower arm switching element S1$n.

The main body part 51 has a flattened rectangular parallelepiped shape. The main body part 51 has a pair of surfaces opposed to each other. One of the surfaces is provided with the plurality of control terminals so as to vertically project from the surface. The other of the surfaces is provided with the power terminals so as to vertically project from the surface.

As shown in FIG. 1, the collector terminals TC of the step-up module Mc, the first $-phase module M1$, and the second $-phase module M2$ are connected to each other. The emitter terminals TE of the step-up module Mc, the first $-phase module M1, and the second $-phase module M2$ are connected to a negative terminal of the high-voltage battery 50.

The connection terminal TA of the first $-phase module M1$ is connected to the $-phase of the first motor generator 10. The connection terminal TA of the second $-phase module M2$ is connected to the $-phase of the second motor generator 20. The connection terminal TA of the step-up module Mc is connected to one of two ends of the reactor 34, which is opposed to the other end to which the positive electrode terminal of the high-voltage battery 50 is connected.

The control unit 40 uses a low-voltage battery 42, which serves as a "DC power supply", as a power supply. The control unit 40 is mainly configured by a microcomputer. The control unit 40 operates the first and second inverters 12, 22 and the step-up converter 30 to control controlled variables (torque) of the first and second motor generators 10, 20 to command values (hereinafter, referred to as "command torque Trq*"). Specifically, the control unit 40 generates an operation signal g1$# and outputs the operation signal g1$# to the drive circuit of the switching element S1$# to turn on or off the switching element S1$# configuring the first inverter 12. In addition, the control unit 40 generates an operation signal g2$# and outputs the operation signal g2$# to the drive circuit of the switching element S2$# to turn on or off the switching element S2$# configuring the second inverter 22. Furthermore, the control unit 40 generates an operation signal gc# and outputs the operation signal gc# to the drive circuit to turn on or off the switching element Sc# configuring the step-up converter 30.

Note that, hereinafter, drive circuits driving the upper and lower arm step-up switching elements Scp, Scn are referred to as upper and lower arm step-up drive circuits Drcp, Drcn, drive circuits driving the first $-phase upper and lower arm switching elements S1$p, S1$n are referred to as first $-phase upper and lower arm drive circuits Dr1$p, Dr1$n. Drive circuits driving the second $-phase upper and lower arm switching elements S2$p, S2$n are referred to as second $-phase upper and lower arm drive circuits Dr2$p, Dr2&n.

In addition, in the present embodiment, each of the drive circuits Drcp, Dr1$p, Dr2$p corresponds to an "upper arm drive circuit". Each of the drive circuits Drcn, Dr1$n, Dr2$n corresponds to a "lower arm drive circuit". That is, the upper arm drive circuits are individually provided so as to correspond to upper arm switching elements. The lower arm drive circuits are individually provided so as to correspond to lower arm switching elements.

Note that upper arm operation signals gcp, g1$p, g2$p and lower arm operation signals gcn, g1$n, g2$n corresponding thereto are complementary to each other. That is, the upper arm switching elements Scp, S1$p, S2$p and the lower arm switching elements Scn, S1$n, S2$n corresponding thereto are alternately turned on.

The low-voltage battery 42 (also referred to as auxiliary unit battery) is a storage battery (e.g. lead-acid battery) whose output voltage is lower than that of the high-voltage battery 50.

An interface 44 has a function of transmitting signals between a high-voltage system and a low-voltage system while providing electrical isolation therebetween. The high-voltage system includes the high-voltage battery 50, the first and second inverters 12, 22, the step-up converter 30, and the first and second motor generators 10, 20. The low-voltage system includes the low-voltage battery 42 and the control unit 40. In the present embodiment, the interface 44 includes an insulation photonic element (photocoupler). Note that, in the present embodiment, a reference potential VstL of the low-voltage system and a reference potential VstH of the high-voltage system are different from each other. Specifically, in the present embodiment, the reference potential VstH of the high-voltage system is set to a potential of the negative electrode of the high-voltage battery 50. The reference potential VstL of the low-voltage system is set to a potential of the body of the vehicle which is a median between the potential of the positive electrode terminal and the potential of the negative electrode terminal of the high-voltage battery 50.

Figure 4:
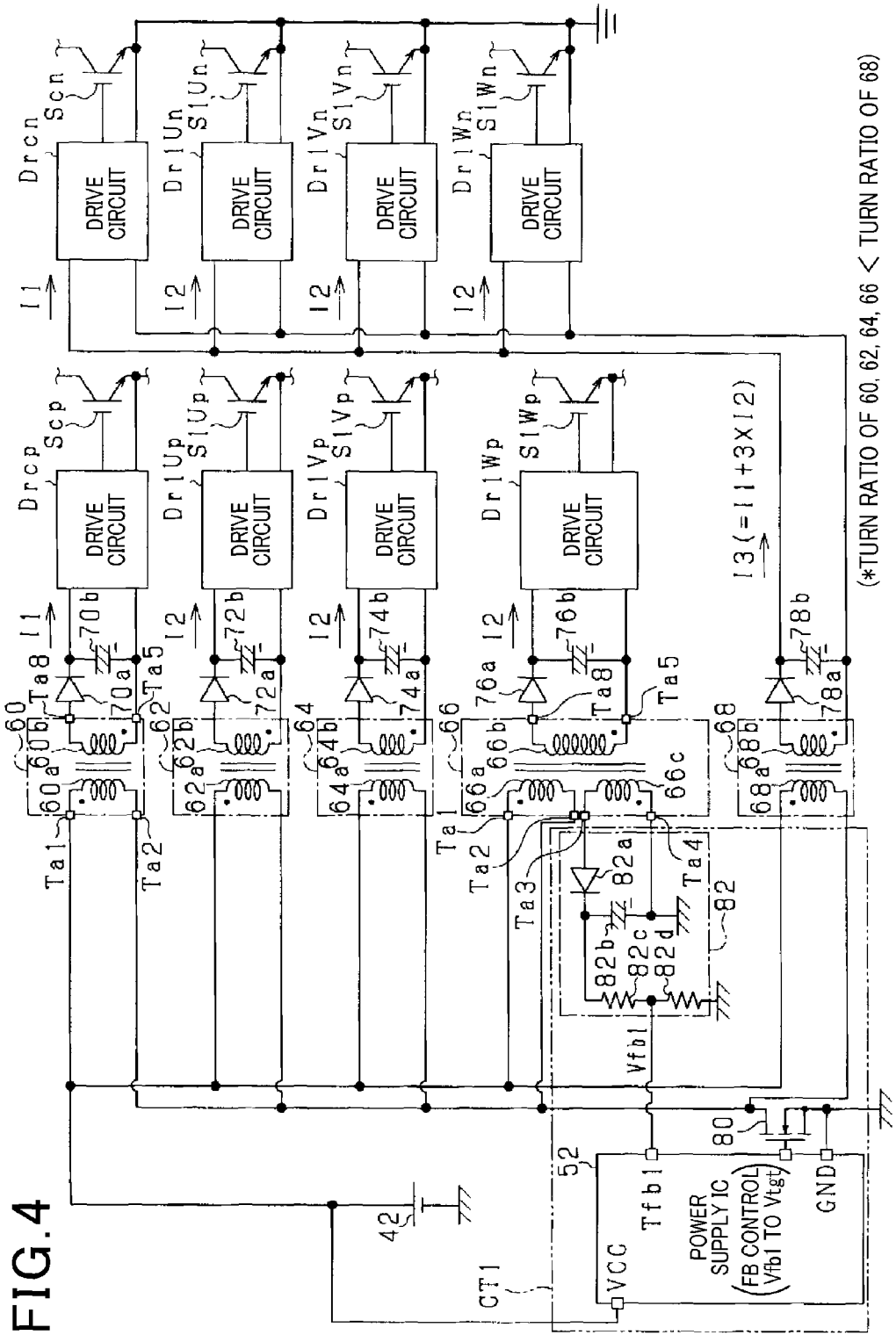
FIG. 4 is a diagram showing an insulated power supply apparatus according to the first embodiment.
Figure 5:
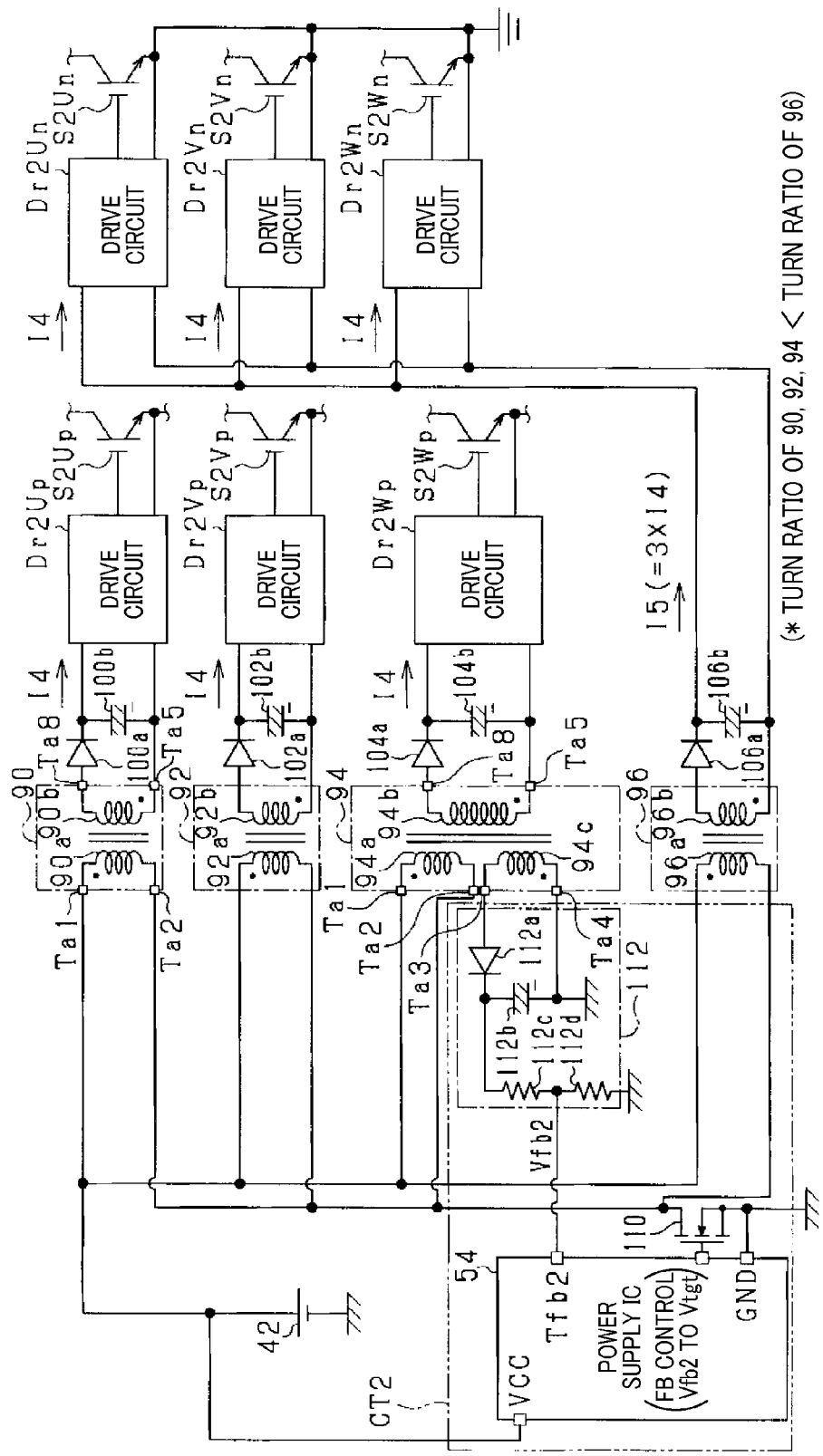
FIG. 5 is a diagram showing an insulated power supply apparatus according to the first embodiment.

Next, with reference to FIGS. 4 and 5, the insulated power supply apparatus is described which supplied drive voltage to drive circuits Drc#, Dr1$#, Dr2$# which drive the switching elements Sc#, S1$#, S2$#, respectively.

In the present embodiment, the first inverter 12, the second inverter 22, and the step-up converter 30 are divided into a group of the first inverter 12 and the step-up converter 30, and the second inverter 22. In addition, a first power supply IC 52 is provided so as to correspond to the group of the first inverter 12 and the step-up converter 30, and a second power supply IC 54 is provided so as to correspond to the second inverter 22. The first power supply IC 52 controls drive voltage applied to the upper and lower arm step-up drive circuits Drcp, Drcn and the first $-phase upper and lower arm drive circuits Dr1$p, and Dr1$n. The second power supply IC 54 controls drive voltage applied to the second $-phase upper and lower arm drive circuits Dr2$p, and Dr2$n.

FIG. 4 shows the insulated power supply apparatus in which the first power supply IC 52 is a main controller.

The insulated power supply apparatus shown in FIG. 4 is a flyback type switching power supply including first to fifth transformers 60, 62, 64, 66, 68, first to fifth diodes 70a, 72a, 74a, 76a, 78a, first to fifth capacitors 70b, 72b, 74b, 76b, 78b, one N-channel MODFET (hereinafter, referred to as "first voltage control switching element 80"), and a first feedback circuit 82. Note that, in the present embodiment, electrolytic capacitors are used as the first to fifth capacitors 70b, 72b, 74b, 76b, 78b. In addition, in the present embodiment, each of the first to fourth transformers 60, 62, 64, 66 corresponds to an "upper arm transformer". The fifth transformer 68 corresponds to a "lower arm transformer".

The upper arm transformers are provided so as to individually correspond to the plurality of upper arm switching elements. Specifically, the first transformer 60 applies drive voltage to the upper arm step-up drive circuit Drcp. The second transformer 62 applies drive voltage to a first U-phase upper arm drive circuit Dr1Up. The third transformer 64 applies drive voltage to a first V-phase upper arm drive circuit Dr1Vp. The fourth transformer 66 applies drive voltage to a first W-phase upper arm drive circuit Dr1Wp.

The lower arm transformer is common to the plurality of lower arm switching elements, and has a common secondary side coil which can apply drive voltage to the lower arm switching elements. Specifically, the fifth transformer 68, which is the common transformer, applies drive voltage to the lower arm step-up drive circuit Drcn and the first U-, V-, W-phase lower arm drive circuits Dr1Un, Dr1Vn, Dr1Wn.

The positive electrode terminal of the low-voltage battery 42 is connected to the negative electrode terminal of the low-voltage battery 42 via a parallel connection of first to fifth primary side coils 60a, 62a, 64a, 66a, 68a configuring the first to fifth transformers 60, 62, 64, 66, 68 and via the first voltage control switching element 80. That is, the first voltage control switching element 80 is provided so as to form a closed circuit including the parallel connection of the first to fifth primary side coils 60a, 62a, 64a, 66a, 68a, the low-voltage battery 42, and the first voltage control switching element 80, when the first voltage control switching element 80 is turned on.

A first secondary side coil 60b configuring the first transformer 60 is connected to the upper arm step-up drive circuit Drcp via the first diode 70a and the first capacitor 70b. A second secondary side coil 62b configuring the second transformer 62 is connected to the first U-phase upper arm drive circuit Dr1Up via the second diode 72a and the second capacitor 72b. A third secondary side coil 64b configuring the third transformer 64 is connected to the first V-phase upper arm drive circuit Dr1Vp via the third diode 74a and the third capacitor 74b. A fourth secondary side coil 66b configuring the fourth transformer 66 is connected to the first W-phase upper arm drive circuit Dr1Wp via the fourth diode 76a and the fourth capacitor 76b.

The fourth transformer 66 further includes a first feedback coil 66c serving as a "voltage detection coil". The first feedback coil 66c is connected to the first power supply IC 52 via the first feedback circuit 82. Specifically, the first feedback circuit 82 includes a first detection diode 82a, a first detection capacitor 82b, a first resistor 82c, and a second resistor 82d. The first feedback circuit 82 has a so-called rectification function of converting the output voltage of the first feedback coil 66c to DC voltage. The output voltage of the first feedback coil 66c passes through the first detection diode 82a, and then is divided by the first resistor 82c and the second resistor 82d. The voltage divided by the first resistor 82c and the second resistor 82d (hereinafter, referred to as "first feedback voltage Vfb1") is applied to the first power supply IC 52 via a first detection terminal Tfb1 of the first power supply IC 52. Note that FIG. 4 shows terminals Ta1 to Ta4, Ta5, Ta8 of the fourth transformer 66 and the like. The terminals are described later.

A fifth secondary side coil 68b configuring the fifth transformer 68 is connected to the lower arm step-up drive circuit Drcn and the first U-, V-, W-phase lower arm drive circuits Dr1Un, Dr1Vn, Dr1Wn via the fifth diode 78a and the fifth capacitor 78b.

Note that, in the present embodiment, the number of turns of the first to fifth secondary side coils 60b, 62b, 64b, 66b, 68b and that of the first feedback coil 68c are set to be the same. This aims to equalize the output voltage of the first feedback coil 68c and that of the first to fifth secondary side coils 60b, 62b, 64b, 66b, 68b.

The first power supply IC 52 is one integrated circuit. The first power supply IC 52 turns on or off the first voltage control switching element 80 to perform feedback control so that the first feedback voltage Vfb1 reaches the target voltage Vtgt. In the present embodiment, the first power supply IC 52, the first voltage control switching element 80, and the first feedback circuit 82 configure a first power supply control section CT1.

In the present embodiment, the turn ratios of the first to fourth transformers 60, 62, 64, 66 (the value obtained by dividing the number of turns N2 of the secondary side coil by the number of turns N1 of the primary side coil), which are the upper arm transformers, are set to be smaller than the number of turns of the fifth transformer 68, which is the lower arm transformer. This aims to make smaller the variation in the output voltage of the first to fifth transformers 60, 62, 64, 66, 68.

That is, in the present embodiment, a current I3 is larger than a current I1 and a current I2. The current I1 is supplied from the first secondary side coil 60b to the upper arm step-up drive circuit Drcp. The current I2 is supplied from the second to fourth secondary side coils 62b, 64b, 66b to the first U-, V-, W-phase upper arm drive circuits Dr1Up, Dr1Vp, Dr1Wp. The current I3 is supplied from the fifth secondary side coil 68b to the first U-, V-, W-phase lower arm drive circuits Dr1Un, Dr1Vn, Dr1Wn. Note that as charging current to be supplied to the gate increases, the output voltage of the secondary side coil decreases. This is because, when exemplifying the first U-phase upper arm switching element S1Up, as the charging current increases, the output current of the second secondary side coil 62b increases, which increases the amount of voltage drop due to DC resistance of the second secondary side coil 62b, the second diode 72a and the like.

Hence, by setting the turn ratios of the first to fourth transformers 60, 62, 64, 66 to be smaller than that of the fifth transformer 68, the variation in the output voltage of the first to fifth transformers 60, 62, 64, 66, 68 can be smaller.

Note that the turn ratio of the first transformer 60 is set to be larger than those of the second to fourth transformers 62, 64, 68. This is because the charging current, which is to be supplied to the gates of the upper and lower arm step-up switching elements Scp, Scn to turn on the upper and lower arm step-up switching elements, is set to be larger than the charging current, which is to be supplied to the gates of the first $-phase upper and lower arm switching elements S1$# to turn on the first $-phase upper and lower arm switching elements S1$#. That is, this is because the gate charge capacity Qg of the upper and lower arm step-up switching elements Scp, Scn is set to be larger than the gate charge capacity Qg of the first $-phase upper and lower arm switching elements S1$#.

FIG. 5 shows the insulated power supply apparatus in which the second power supply IC 54 is a main controller.

The insulated power supply apparatus shown in FIG. 5 is a flyback type switching power supply including sixth to ninth transformers 90, 92, 94, 96, sixth to ninth diodes 100a, 102a, 104a, 106a, sixth to ninth capacitors 100b, 102b, 104b, 106b, one N-channel MODFET (hereinafter, referred to as "second voltage control switching element 110"), and a second feedback circuit 112. Note that, in the present embodiment, electrolytic capacitors are used as the sixth to ninth capacitors 100b, 102b, 104b, 106b. In addition, in the present embodiment, each of the sixth to eighth transformers 90, 92, 94 corresponds to an "upper arm transformer". The ninth transformer 96 corresponds to a "lower arm transformer".

The sixth transformer 90 applies drive voltage to a second U-phase upper arm drive circuit Dr2Up. The seventh transformer 92 applies drive voltage to a second V-phase upper arm drive circuit Dr2Vp. The eighth transformer 94 applies drive voltage to a second W-phase upper arm drive circuit Dr2Wp.

The ninth transformer 96 applies drive voltage to the second U-, V-, W-phase lower arm drive circuits Dr2Un, Dr2Vn, Dr2Wn.

The positive electrode terminal of the low-voltage battery 42 is connected to the negative electrode terminal of the low-voltage battery 42 via a parallel connection of sixth to ninth primary side coils 90a, 92a, 94a, 96a configuring the sixth to ninth transformers 90, 92, 94, 96 and via the second voltage control switching element 110. That is, the second voltage control switching element 110 is provided so as to form a closed circuit including the parallel connection of the sixth to ninth primary side coils 90a, 92a, 94a, 96a, the low-voltage battery 42, and the second voltage control switching element 110 when the second voltage control switching element 110 is turned on.

A sixth secondary side coil 90b configuring the sixth transformer 90 is connected to the second U-phase upper arm drive circuit Dr2Up via the sixth diode 100a and the sixth capacitor 100b. A seventh secondary side coil 92b configuring the seventh transformer 92 is connected to the second V-phase upper arm drive circuit Dr2Vp via the seventh diode 102a and the seventh capacitor 102b. A eighth secondary side coil 104b configuring the eighth transformer 94 is connected to the second W-phase upper arm drive circuit Dr2Wp via the eighth diode 104a and the eighth capacitor 104b.

The eighth transformer 94 further includes a second feedback coil 96c serving as a "voltage detection coil". The second feedback coil 94c is connected to the second power supply IC 54 via the second feedback circuit 112. Specifically, the second feedback circuit 112 includes a second detection diode 112a, a second detection capacitor 112b, a third resistor 112c, and a fourth resistor 112d. The output voltage of the second feedback coil 96c passes through the second detection diode 112a, and then is divided by the third resistor 112c and the fourth resistor 112d. The voltage divided by the third resistor 112c and the fourth resistor 112d (hereinafter, referred to as "second feedback voltage Vfb2") is applied to the second power supply IC 54 via a second detection terminal Tfb2 of the second power supply IC 54.

A ninth secondary side coil 96b configuring the ninth transformer 96 is connected to the second U-, V-, W-phase lower arm drive circuits Dr2Un, Dr2Vn, Dr2Wn via the ninth diode 106a and the ninth capacitor 106b.

Note that, in the present embodiment, the number of turns of the sixth to ninth secondary side coils 90b, 92b, 94b, 96b and that of the second feedback coil 94c are set to be the same. This aims to equate the output voltage of the second feedback coil 94c and that of the sixth to ninth secondary side coils 90b, 92b, 94b, 96b.

The second power supply IC 54 is one integrated circuit. The second power supply IC 54 turns on or off the second voltage control switching element 110 to perform feedback control so that the second feedback voltage Vfb2 reaches the target voltage Vtgt. In the present embodiment, the second power supply IC 54, the second voltage control switching element 110, and the second feedback circuit 112 configure a second power supply control section CT2.

In the present embodiment, the turn ratios of the sixth to eighth transformers 90, 92, 94 are set to be smaller than the number of turns of the ninth transformer 96 which is the lower arm transformer. This aims to make smaller the variation in the output voltage of the sixth to ninth transformers 90, 92, 94, 96. That is, in the present embodiment, a current I5 is larger than a current I4. The current I4 is supplied from the sixth to eighth secondary side coils 90b, 92b, 94b to the second U-, V-, W-phase upper arm drive circuits Dr2Up, Dr2Vp, Dr2Wp. The current I5 is supplied from the ninth secondary side coils 96b to the second U-, V-, W-phase lower arm drive circuits Dr2Un, Dr2Vn, Dr2Wn.

Figure 6:
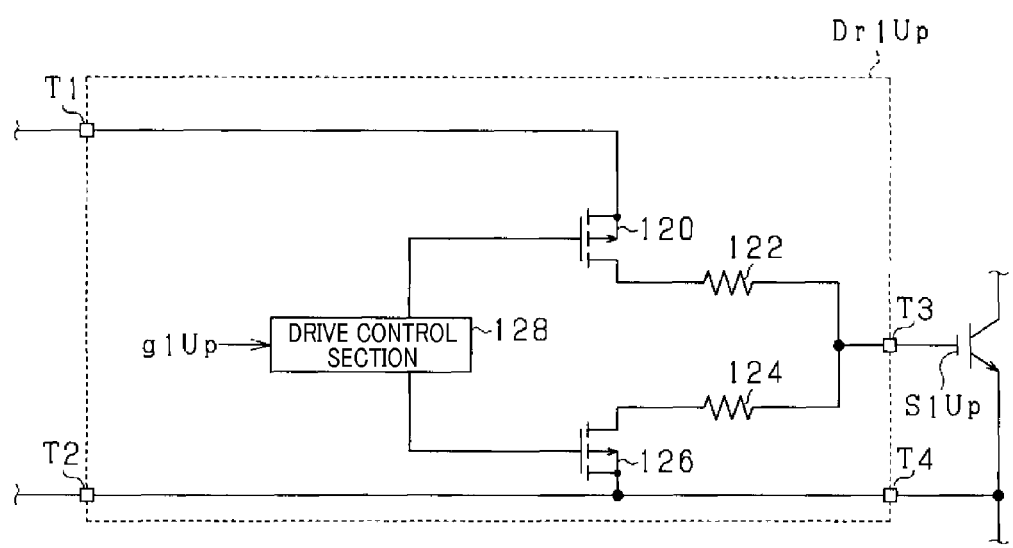
FIG. 6 is a diagram showing an IGBT drive circuit according to the first embodiment.

Next, with reference to FIG. 6, the drive circuits Drc#, Dr1$#, Dr2$# are described in detail. The drive circuits Drc#, Dr1$#, Dr2$# have the same configuration. Hence, the configuration of the drive circuit is described by taking the first U-phase upper arm drive circuit Dr1Up as an example.

The connection point of the second diode 72a and the second capacitor 72b is connected to a first terminal T1 of the first U-phase upper arm drive circuit Dr1Up shown in FIG. 6. The connection point of the second secondary side coil 62b and the second capacitor 72b is connected to a second terminal T2 of the first U-phase upper arm drive circuit Dr1Up The first terminal T1 is connected to the gate of the first U-phase upper arm switching element S1Up via a P-channel MODFET (hereinafter, referred to as a "charging switching element 120"), a charging resistor 122, and a third terminal T3 of the first U-phase upper arm drive circuit Dr1Up. The gate of the first U-phase upper arm switching element S1Up is connected to the emitter of the first U-phase upper arm switching element S1Up via the third terminal T3, a discharging resistor 124, an N-channel MOSFET (hereinafter, referred to as a "discharging switching element 126"), and a fourth terminal T4 of the first U-phase upper arm drive circuit Dr1Up. The second terminal T2 is short-circuited to the fourth terminal T4 in the first U-phase upper arm drive circuit Dr1Up.

The first U-phase upper arm drive circuit Dr1Up includes a drive control section 128. The drive control section 128 alternately performs a charging process and a discharging process by operations of the charging switching element 120 and the discharging switching element 126 based on an operation signal g1Up received from the control unit 40 via the interface 44, to drive the first U-phase upper arm switching element S1Up. Specifically, in the charging process, if the operation signal g1Up is determined to have been an ON operation command, the discharging switching element 126 is turned off, and the charging switching element 120 is turned on. In the discharging process, if the operation signal g1Up is determined to have been an OFF operation command, the discharging switching element 126 is turned on, and the charging switching element 120 is turned off. Hence, the first U-phase upper arm switching element S1Up is driven.

Figure 7:
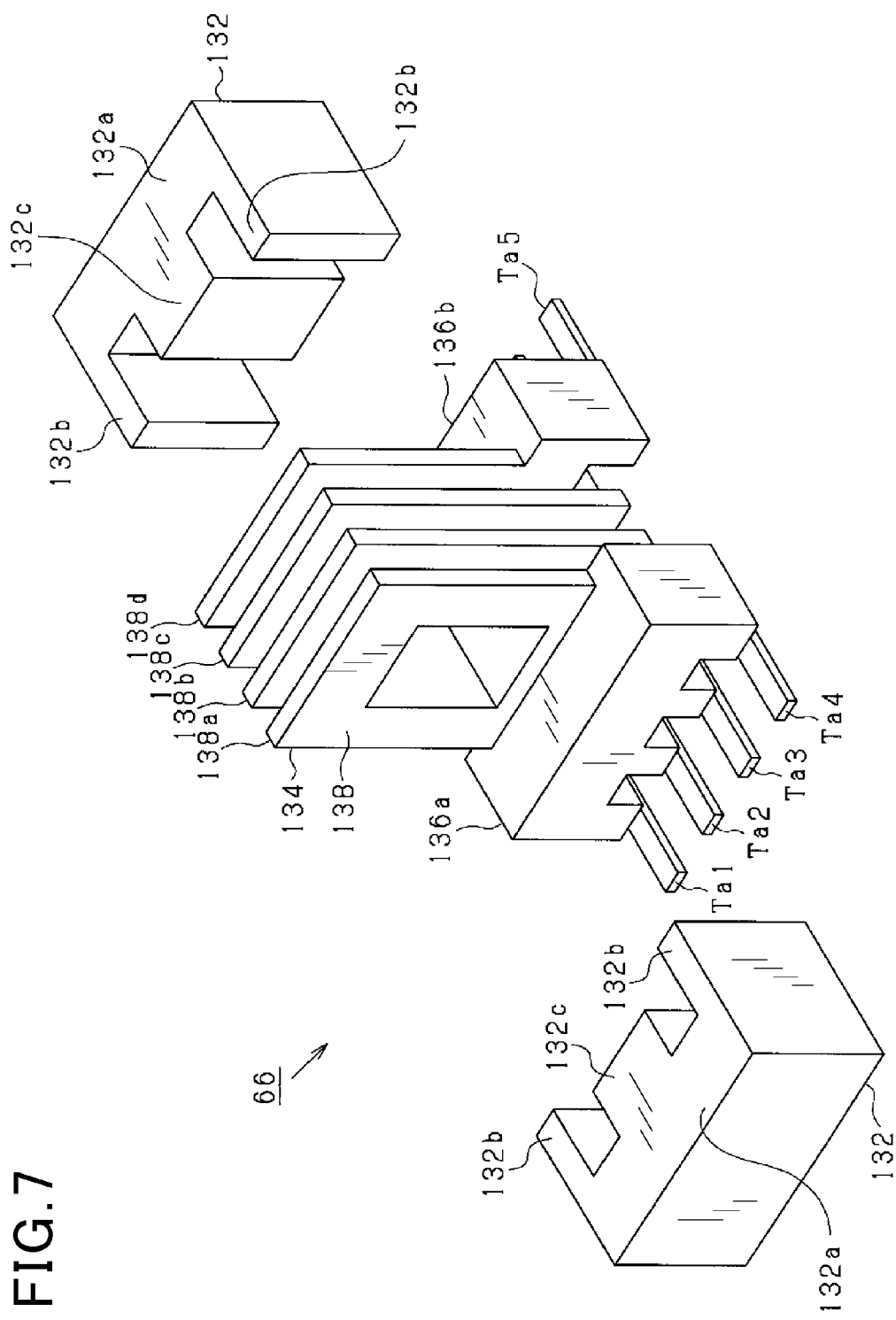
FIG. 7 is a perspective view of a transformer according to the first embodiment.
Figure 8:
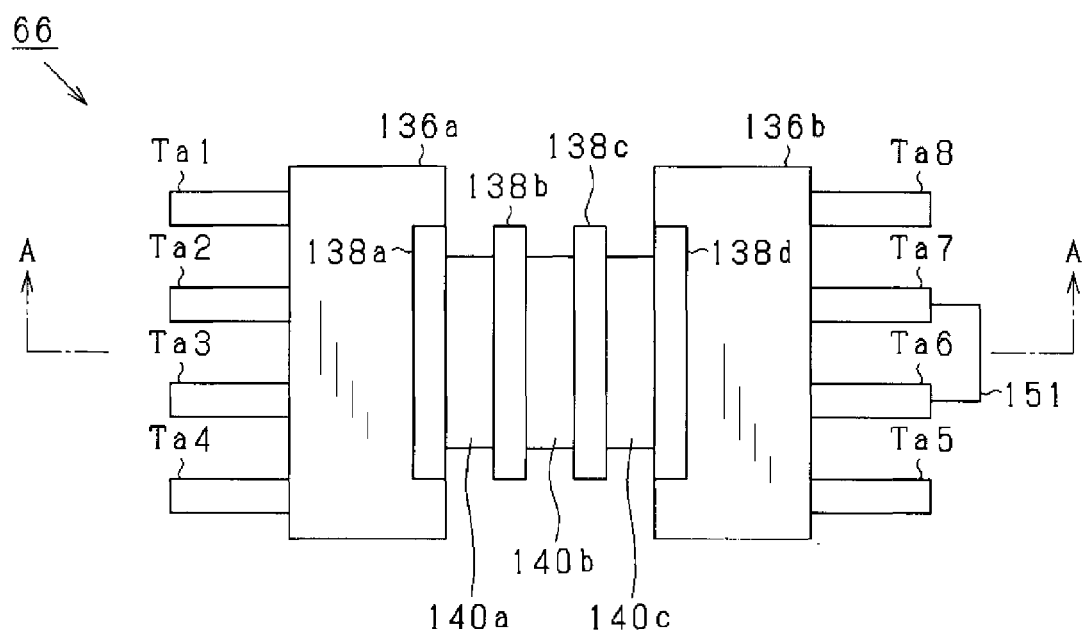
FIG. 8 is a plan view of the transformer according to the first embodiment.
Figure 9:
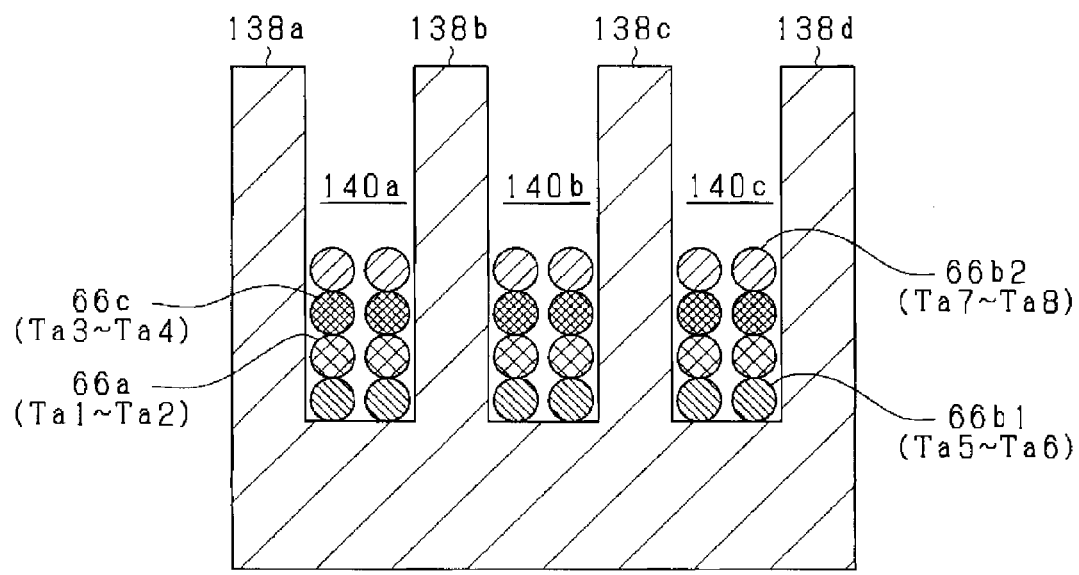
FIG. 9 is a sectional view cut along the line A-A of a circular portion in FIG. 8.

Next, with reference to FIGS. 7 to 9, the configuration of the transformers 60, 62, 64, 66, 68, 90, 92, 94, 96 is described by taking the fourth transformer 66 as an example. FIG. 7 is a perspective view of the fourth transformer 66. FIG. 8 is a plan view of the fourth transformer 66. FIG. 9 is a part of a sectional view cut along the line A-A of FIG. 8. Note that, in FIGS. 7 and 8, the fourth primary side coil 66a and the fourth secondary side coil 66b are not shown.

As shown in FIG. 7, the transformer 66 includes a pair of cores 132 and a bobbin 134. The cores 132 are a pair of members having the same shape. Each of the members has a bottom wall part 132a having a long-length shape, a pair of sidewall parts 132b, and a center wall part 132c. The pair of sidewall parts 132b respectively extend from one end and the other end, which are positioned in the longitudinal direction of the bottom wall part 132a, in the direction departing from bottom wall part 132a. The center wall part 132c extends from the center portion, which is positioned at the center in the longitudinal direction of the bottom wall part 132a, in the direction departing from the bottom wall part 132a. That is, the core 132 has a substantially E-shape.

End faces of the pair of sidewall parts 132b included in one of the pair of members contact end faces of the sidewall parts 132b included in the other of the pair of members. An end face of the center wall part 132c included in one of the pair of members does not contact an end face of the center wall part 132c included in the other of the pair of members. The end faces are separated from each other.

The bobbin 134 is made of insulating resin, and includes a first terminal block 136a, a second terminal block 136b, and a circular portion 138. The circular portion 138 has a circular cross-sectional shape perpendicularly cut with respect to the axial direction (the direction in which the center wall part 132c is inserted). In the space formed by the inner periphery, the center wall part 132c of the core 132 is inserted.

On the peripheral surface of the circular portion 138, a plurality of division plates (first to fourth division plates 138a to 138d) are provided. The first to fourth division plates 138a to 138d erect in plate shapes over the whole circumference and along the circumferential direction of the peripheral surface of the circular portion 138. The first to fourth division plates 138a to 138d divide the peripheral surface of the circular portion 138 into three sections in the axial direction thereof. In the present embodiment, as shown in FIG. 8, the sections are referred to as a first section 140a, a second section 140b, and a third section 140c from left to right.

One of two ends positioned in the axial direction of the circular portion 138 is provided with the first terminal block 136a. The other of the two ends is provided with the second terminal block 136b. The first terminal block 136a and the second terminal block 136b are made of the same insulating resin as that of the circular portion 138. Hence, the first terminal block 136a and the second terminal block 136b are integrated with the circular portion 138.

The first terminal block 136a is provided with the first to fourth transformer terminals Ta1 to Ta4. The terminals Ta1 to Ta4 are arranged at predetermined intervals and along the longitudinal direction of the first terminal block 136a. The second terminal block 136b is provided with the fifth to eighth transformer terminals Ta5 to Ta8. The terminals Ta5 to Ta8 are arranged at predetermined intervals and along the longitudinal direction of the second terminal block 136b.

The fourth primary side coil 66a, the fourth secondary side coil 66b, and first feedback coil 66c are insulated lines made of copper lines provided with an insulation film having high electrical insulation characteristics. The fourth secondary side coil 66b is formed of a first winding 66b1 and a second winding 66b2. As shown in FIG. 9, the fourth primary side coil 66a, the first winding 66b1, the second winding 66b2, and the first feedback coil 66c are wound around the outer periphery surface of the circular portion 138 in the first to third sections 140a to 140c so as to be laminated.

One end of the first winding 66b1 serving as one end of the fourth secondary side coil 66b is connected to the eighth transformer terminal Ta8. The eighth transformer terminal Ta8 is connected to the anode of the fourth diode 76a. The other end of the first winding 66b1 is connected to the seventh transformer terminal Ta7. The seventh transformer terminal Ta7 is connected to the sixth transformer terminal Ta6 by a wiring pattern 151 formed on a substrate 150. The sixth transformer terminal Ta6 is connected to one end of the second winding 66b2. The other end of the second winding 66b2 is the other end of the fourth secondary side coil 66b, and is connected to the fifth transformer terminal Ta5. The fifth transformer terminal Ta5 is connected to the negative electrode terminal of the fourth capacitor 76b.

One end of the first feedback coil 66c is connected to the third transformer terminal Ta3. The other end of the first feedback coil 66c is connected to the fourth transformer terminal Ta4. The third transformer terminal Ta3 is connected to the anode of the first detection diode 82a. The fourth transformer terminal Ta4 is grounded.

Note that, in the present embodiment, the first to third transformers 60, 62, 64, the fifth to seventh transformers 68, 90, 92, and the ninth transformer 96 do not include a feedback coil as described above. Hence the structure of the transformers 60, 62, 64, 68, 90, 92, 96 can be obtained by eliminating the third transformer terminal Ta3 and the fourth transformer terminal Ta4 from the fourth transformer 66 shown in FIGS. 7 and 8 and by eliminating the first feedback coil 66c shown in FIG. 9.

Figure 10:
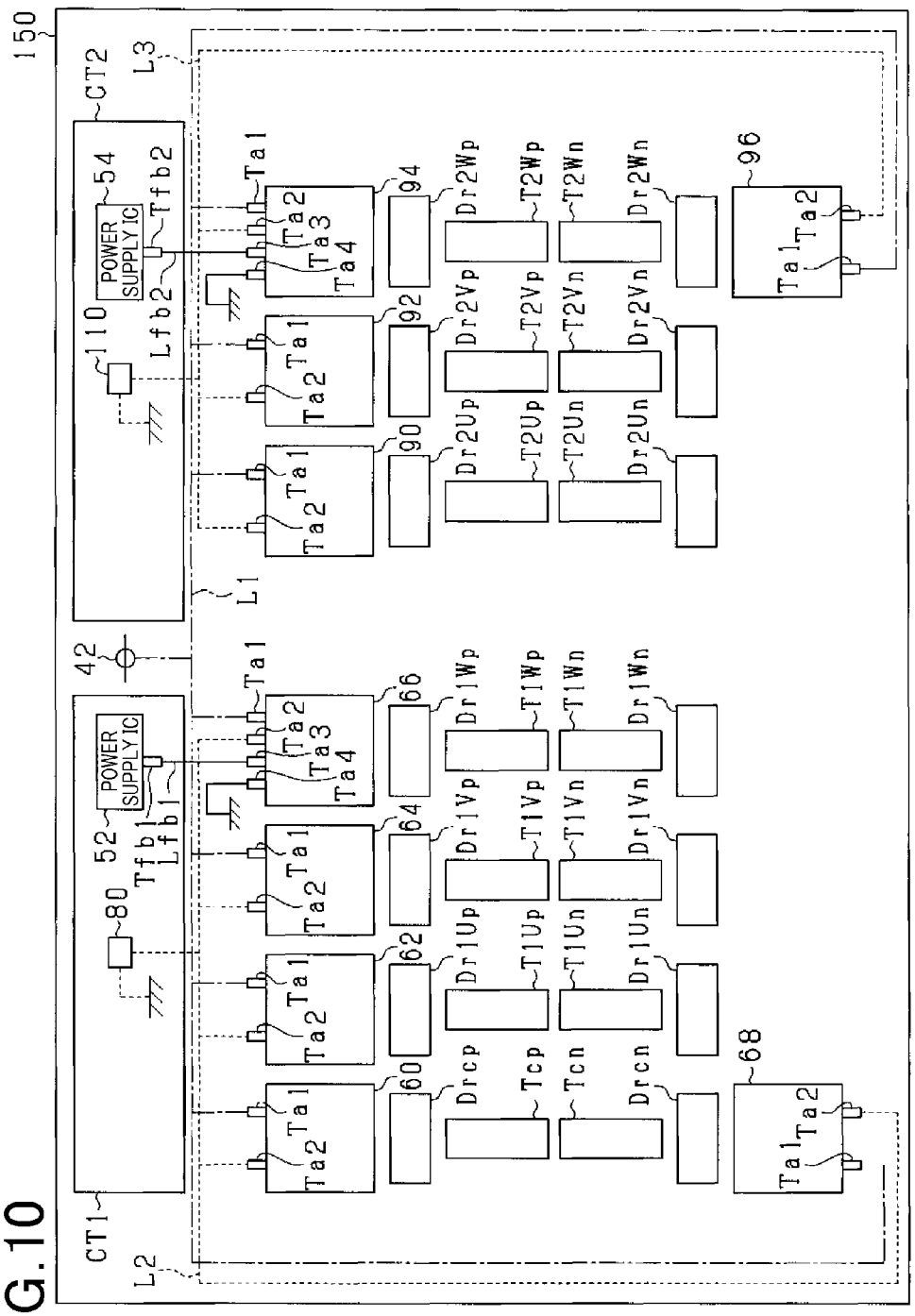
FIG. 10 is a plan view of a substrate according to the first embodiment.

Next, with reference to FIG. 10, a technique for arranging the transformers and the like on the substrate 150 is described. In FIG. 10, the first feedback circuit 82, the second feedback circuit 112, the fifth to eighth transformer terminals Ta5 to Ta8 included in the transformers and the like are not shown. In the present embodiment, each of the first power supply control section CT1 and the second power supply control section CT2 corresponds to a "first target control section".

As shown in FIG. 10, the substrate 150 is a multilayer substrate having a rectangular shape. The substrate 150 has a pair of external layers (a first surface and a second surface which is the back of the first surface), and a plurality of internal layers sandwiched between the pair of external layers. When viewing the first surface of the substrate 150 from the front thereof, a step-up upper arm connection section Tcp, first U-, V-, W-phase upper arm connection sections T1Up, T1Vp, T1Wp, and second U-, V-, W-phase upper arm connection sections T2Up, T2Vp, T2Wp are provided on the substrate 150 so as to be arranged in line. In addition, the connection sections Tcp, T1Up, T1Vp, T1Wp, T2Up, T2Vp, T2Wp are provided on the center portion of the substrate 150 positioned in the direction, in which a plane parallel to the surface of the substrate 150 extends and which is orthogonal to the direction in which the connection sections Tcp, T1Up, T1Vp, T1Wp, T2Up, T2Vp, T2Wp are arranged. Note that, hereinafter, the connection sections Tcp, T1Up, T1Vp, T1Wp, T2Up, T2Vp, T2Wp may be collectively referred to as an "upper arm connection section".

Meanwhile, when viewing the first surface of the substrate 150 from the front thereof, a step-up lower arm connection section Tcn, first U-, V-, W-phase lower arm connection sections T1Un, T1Vn, T1Wn, and second U-, V-, W-phase lower arm connection sections T2Un, T2Vn, T2Wn are arranged on the substrate 150 so as to be arranged in line in the direction in which the upper arm connection sections Tcp, T1Up, T1Vp, T1Wp, T2Up, T2Vp, T2Wp are arranged. The connection sections Tcn, T1Un, T1Vn, T1Wn, T2Un, T2Vn, T2Wn are provided on the substrate 150 so as to be adjacent to the upper arm connection sections Tcp, T1Up, T1Vp, T1Wp, T2Up, T2Vp, T2Wp, when viewing the first surface of the substrate 150 from the front thereof. More specifically, the connection sections Tcn, T1Un, T1Vn, T1Wn, T2Un, T2Vn, T2Wn are arranged in parallel with the upper arm connection sections Tcp, T1Up, T1Vp, T1Wp, T2Up, T2Vp, T2Wp, when viewing the first surface of the substrate 150 from the front thereof. Note that, hereinafter, the connection sections Tcn, T1Un, T1Vn, T1Wn, T2Un, T2Vn, T2Wn may be collectively referred to as a "lower arm connection section".

The step-up module Mc is attached to the step-up upper and lower arm connection sections Tcp, Tcn from the side of the second surface of the substrate 150. Thereby, the gates of the upper and lower arm step-up switching elements Scp, Scn are connected to the step-up upper and lower arm connection sections Tcp, Tcn (see FIG. 3). The first \$-phase modules M1\$ are attached to the first \$ phase upper and lower arm connection sections T1\$p, T1\$n from the side of the second surface of the substrate 150. Thereby, the gates of the first \$-phase upper and lower arm switching elements S1\$p, S1\$n are connected to the first \$ phase upper and lower arm connection sections T1\$p, T1\$n. The second $-phase modules M2$ are attached to the second $ phase upper and lower arm connection sections T2$p, T2$n from the side of the second surface of the substrate 150. Thereby, the gates of the second $-phase upper and lower arm switching elements S2$p, S2$n are connected to the second $ phase upper and lower arm connection sections T2$p, T2$n.

When viewing the first surface of the substrate 150 from the front thereof, the first power supply control section CT1 is provided in an area opposed to the lower arm connection sections Tcn, T1Un, T1Vn, T1Wn corresponding to the first power supply control section CT1 with respect to the upper arm connection sections Tcp, T1Up, T1Vp, T1Wp corresponding to the first power supply control section CT1. When viewing the first surface of the substrate 150 from the front thereof, the first to fourth transformers 60, 62, 64, 66 corresponding to the first power supply control section CT1 are provided in an area sandwiched between the first power supply control section CT1 and the upper arm connection sections Tcp, T1Up, T1Vp, T1Wp corresponding to the first power supply control section CT1, so as to be adjacent to the first power supply control section CT1, and in the direction in which the upper arm connection sections Tcp, T1Up, T1Vp, T1Wp corresponding to the first power supply control section CT1 are arranged, and so as to be in line. The first to fourth transformers 60, 62, 64, 66 are provided so that the first transformer terminals Ta1 and the second transformer terminals Ta2 thereof are adjacent to the first power supply control section CT1. Note that, in the sandwiched area, the upper arm drive circuits Drcp, Dr1Up, Dr1Vp, Dr1Wp corresponding to the first power supply control section CT1 are provided between the first to fourth transformers 60, 62, 64, 66 and the upper arm connection sections Tcp, T1Up, T1Vp, T1Wp corresponding to the first power supply control section CT1 and in the direction in which the upper arm connection sections Tcp, T1Up, T1Vp, T1Wp are arranged, so as to be in line.

When viewing the first surface of the substrate 150 from the front thereof, the lower arm drive circuits Drcn, Dr1Un, Dr1Vn, Dr1Wn corresponding to the first power supply control section CT1 are provided in an area opposed to the first to fourth transformers 60, 62, 64, 66 with respect to the lower arm connection sections Tcn, T1Un, T1Vn, T1Wn corresponding to the first power supply control section CT1, and in the direction in which the lower arm connection sections Tcn, T1Un, T1Vn, T1Wn are arranged, so as to be in line. The fifth transformer 68 is provided at the side opposed to the step-up lower arm connection section Tcn with respect to the lower arm drive circuit Drcn. The fifth transformer 68 is provided so that the first transformer terminal Ta1 and the second transformer terminal Ta2 thereof are positioned at the side opposed to the lower arm drive circuit Drcn.

When viewing the first surface of the substrate 150 from the front thereof, the second power supply control section CT2 is provided in an area opposed to the lower arm connection sections T2Un, T2Vn, T2Wn corresponding to the second power supply control section CT2 with respect to the upper arm connection sections T2Up, T2Vp, T2Wp corresponding to the second power supply control section CT2. When viewing the first surface of the substrate 150 from the front thereof, the sixth to eighth transformers 90, 92, 94 corresponding to the second power supply control section CT2 are provided in an area sandwiched between the second power supply control section CT2 and the upper arm connection sections T2Up, T2Vp, T2Wp corresponding to the second power supply control section CT2, so as to be adjacent to the second power supply control section CT2, and in the direction in which the upper arm connection sections T2Up, T2Vp, T2Wp corresponding to the second power supply control section CT2 are arranged, and so as to be in line. The sixth to eighth transformers 90, 92, 94 are provided so that the first transformers Ta1 and the second transformers Ta thereof are adjacent to the second power supply control section CT2. Note that, in the sandwiched area, the upper arm drive circuits Dr2Up, Dr2Vp, Dr2Wp corresponding to the second power supply control section CT2 are provided between the sixth to eighth transformers 90, 92, 94 and the upper arm connection sections T2Up, T2Vp, T2Wp corresponding to the second power supply control section CT2 and in the direction in which the upper arm connection sections T2Up, T2Vp, T2Wp are arranged, so as to be in line.

When viewing the first surface of the substrate 150 from the front thereof, the lower arm drive circuits Dr2Un, Dr2Vn, Dr2Wn corresponding to the second power supply control section CT2 are provided in an area opposed to the sixth to eighth transformers 90, 92, 94 with respect to the lower arm connection sections T2Un, T2Vn, T2Wn corresponding to the second power supply control section CT2, and in the direction in which the lower arm drive circuits Dr2Un, Dr2Vn, Dr2Wn corresponding to the second power supply control section CT2 are arranged, so as to be in line. The ninth transformer 96 is provided at the side opposed to the second W-phase lower arm connection section T2Wn with respect to the second W-phase lower arm drive circuit Dr2Wn. The ninth transformer 96 is provided so that the first transformer terminal Ta1 and the second transformer terminal Ta2 thereof are positioned at the side opposed to the second W-phase lower arm drive circuit Dr2Wn.

The first power supply IC 52 configuring the first power supply control section CT1 is provided at a position adjacent to the fourth transformer 66 so that the first detection terminal Tfb1 is directed toward the fourth transformer 66. In the present embodiment, of the first to fourth transformers 60, 62, 64, 66 provided so as to be adjacent to the first power supply control section CT1, the transformer whose distance to the first detection terminal Tfb1 is the shortest, when viewing the first surface of the substrate 150 from the front thereof, is the fourth transformer 66. In the present embodiment, the third transformer terminal Ta3 of the fourth transformer 66 and the first detection terminal Tfb1 of the first power supply IC 52 are connected by a first electric path Lfb1. The first electric path Lfb1 is configured by a wiring pattern formed on the first feedback circuit 82 and the substrate 150, and transfers the first feedback voltage Vfb1 to the first power supply IC 52. Specifically, the first electric path Lfb1 is a path from the third transformer terminal Ta3 of the fourth transformer 66 to the first detection terminal Tfb1 via the first feedback circuit 82.

The second power supply IC 54 configuring the second power supply control section CT2 is provided at a position adjacent to the eighth transformer 94 so that the second detection terminal Tfb2 is directed toward the eighth transformer 94. In the present embodiment, of the sixth to eighth transformers 90, 92, 94 provided so as to be adjacent to the second power supply control section CT2, the transformer whose distance to the second detection terminal Tfb2 is the shortest, when viewing the first surface of the substrate 150 from the front thereof, is the eighth transformer 94. In the present embodiment, the third transformer terminal Ta3 of the eighth transformer 94 and the second detection terminal Tfb2 of the second power supply IC 54 are connected by a second electric path Lfb2. The second electric path Lfb2 is configured by a wiring pattern formed on the second feedback circuit 112 and the substrate 150, and transfers the second feedback voltage Vfb2 to the second power supply IC 54. Specifically, the second electric path Lfb2 is a path from the third transformer terminal Ta3 of the eighth transformer 94 to the second detection terminal Tfb2 via the second feedback circuit 112.

The first transformer terminals Ta1 of the first to ninth transformers 60, 62, 64, 66, 68, 90, 92, 94, 96 are connected to each other by a first wiring pattern L1, and are connected to the low-voltage battery 42 by the first wiring pattern L1. The second transformer terminals Ta2 of the first to fifth transformers 60, 62, 64, 66, 68 are connected to each other by a second wiring pattern L2. The second transformer terminals Ta2 of the sixth to ninth transformers 90, 92, 94, 96 are connected to each other by a third wiring pattern L3.

Note that, in the present embodiment, the first wiring pattern L1, the second wiring pattern L2, and the first electric path Lfb1 are formed in different internal layers of the substrate 150. Hence, in FIG. 10, although there is a crossing section of the first wiring pattern L1, the second wiring pattern L2, and the first electric path Lfb1, the wiring patterns L1, L2 and the electric path Lfb1 are not electrically connected at this crossing section. The first wiring pattern L1, the third wiring pattern L3, and the second electric path Lfb2 are in the similar manner.

In the present embodiment, the electric paths transferring feedback voltage are configured as described to shorten the electric paths, thereby enhancing accuracy in controlling the output voltage of the secondary side coil in the feedback control, and avoiding malfunctions of the first and second power supplies IC 52, 54. Taking as an example the insulated power supply apparatus whose main controller is the first power supply IC 52, the above configuration can shorten the first electric path Lfb1. Shortening the first electric path Lfb1 can decrease the amount of voltage drop in the first electric path Lfb1, and can suppress superimposition of noise on the voltage signal transferred to the first electric path Lfb1.

Next, an overvoltage protection function of the first power supply IC 52 and the second power supply IC 54 is described by taking the first power supply IC 52 as an example.

Figure 11:
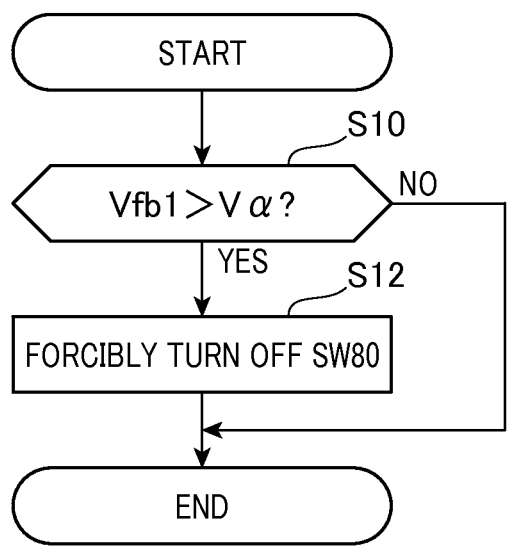
FIG. 11 is a flowchart showing a procedure of an over-voltage malfunction determination process according to the first embodiment.

FIG. 11 shows a procedure of an overvoltage malfunction determination process according to the present embodiment. This process is repeatedly performed, for example, at a predetermined interval by the first power supply IC 52. Note that since the first power supply IC 52 is hardware, the process shown in FIG. 11 is performed by logic circuits in practice.

In this process, first in step S10, the first power supply IC 52 determines whether or not the first feedback voltage Vfb1 has exceeded a specified voltage Vα. The specified voltage Vα may be set to, for example, an upper limit which can maintain reliability of the components of the insulated power supply apparatus.

If an affirmative judgement is made in step S10, the first power supply IC 52 determines that the output voltage of the secondary side coil is excessively high, and the process proceeds to step S12. In step S12, the first power supply IC 52 forcibly turns off the first voltage control switching element 80. Thereby, supplying drive voltage by the first power supply IC 52 to the drive circuits Drc#, Dr1$# is forcibly stopped. Hence, the components of the insulated power supply apparatus such as the drive circuits Drc#, Dr1$# and the switching elements Sc#, S1$# can be protected from overvoltage. Note that, in the present embodiment, the present step corresponds to "forced operation means".

If a negative judgement is made in step S10, or step 12 is completed, the process is temporarily stopped.

According to the embodiment described above, the following advantages can be obtained.

(1) In the insulated power supply apparatus whose main controller is the first power supply IC 52 (second power supply IC 54), when viewing the first surface of the substrate 150 from the front thereof, the first to fourth transformers 60, 62, 64, 66 (sixth to eighth transformers 90, 92, 94) are arranged so as to be adjacent to the first power supply control section CT1 (second power supply control section CT2). Of the first to fourth transformers 60, 62, 64, 66 (sixth to eighth transformers 90, 92, 94), the third transformer terminal Ta3 of the fourth transformer 66 (eighth transformer 94) whose distance to the first detection terminal Tfb1 (second detection terminal Tfb2) when viewing the first surface of the substrate 150 from the front thereof is the shortest and the first detection terminal Tfb1 (second detection terminal Tfb2) are connected by the first electric path Lfb1 (second electric path Lfb2). Hence, the first electric path Lfb1 (second electric path Lfb2) can be shortened. Hence, the amount of voltage drop in the first electric path Lfb1 (second electric path Lfb2) can be decreased, and superimposition of noise on the voltage signal transferred to the first electric path Lfb1 (second electric path Lfb2) can be suppressed. Hence, accuracy in controlling the output voltage of the secondary side coil by the first power supply IC 52 (second power supply IC 54) can be enhanced. In addition, malfunctions of the first power supply IC 52 (second power supply IC 54) can be avoided.

Specifically, in the present embodiment, a value is used as the first feedback voltage Vfb1 (second feedback voltage Vfb2) which is obtained by dividing the output voltage of the first feedback coil 66c (second feedback coil 94c) by the first resistor 82c and the second resistor 82d (third resistor 112c and fourth resistor 112d). Hence, the influence of noise on a voltage signal transmitted through the first electric path Lfb1 (second electric path Lfb2) easily becomes significant. Therefore, employing the configuration, in which the third transformer terminal Ta3 having the fourth transformer 66 (eighth transformer 94) and the first detection terminal Tfb1 (second detection terminal Tfb2) are connected by the first electric path Lfb1 (second electric path Lfb2), provides great advantages.

(2) The first feedback circuit 82 (second feedback circuit 112) is provided so as to correspond to only the fourth transformer 66 (eighth transformer 94) included in the first to fifth transformers 60, 62, 64, 66, 68 (sixth to ninth transformers 90, 92, 94, 96) and including the first feedback coil 66c (second feedback coil 94c). Hence, the number of components can be decreased, thereby miniaturizing the insulated power supply apparatus and reducing the manufacturing cost of the insulated power supply apparatus.

(3) The first to fifth primary side coils 60a, 62a, 64a, 66a, 68a (sixth to ninth primary side coils 90a, 92a, 94a, 96a) are connected in parallel. According to this configuration, even when inductances of the primary side coils vary due to the individual difference of the primary side coils and the like, applied voltage of the primary side coils connected in parallel can be theoretically equalized. Hence, the output voltage of the first to fifth secondary side coils 60b, 62b, 64b, 66b, 68b (sixth to ninth secondary side coils 90b, 92b, 94b, 96b) can be stabilized.

Figure 12:
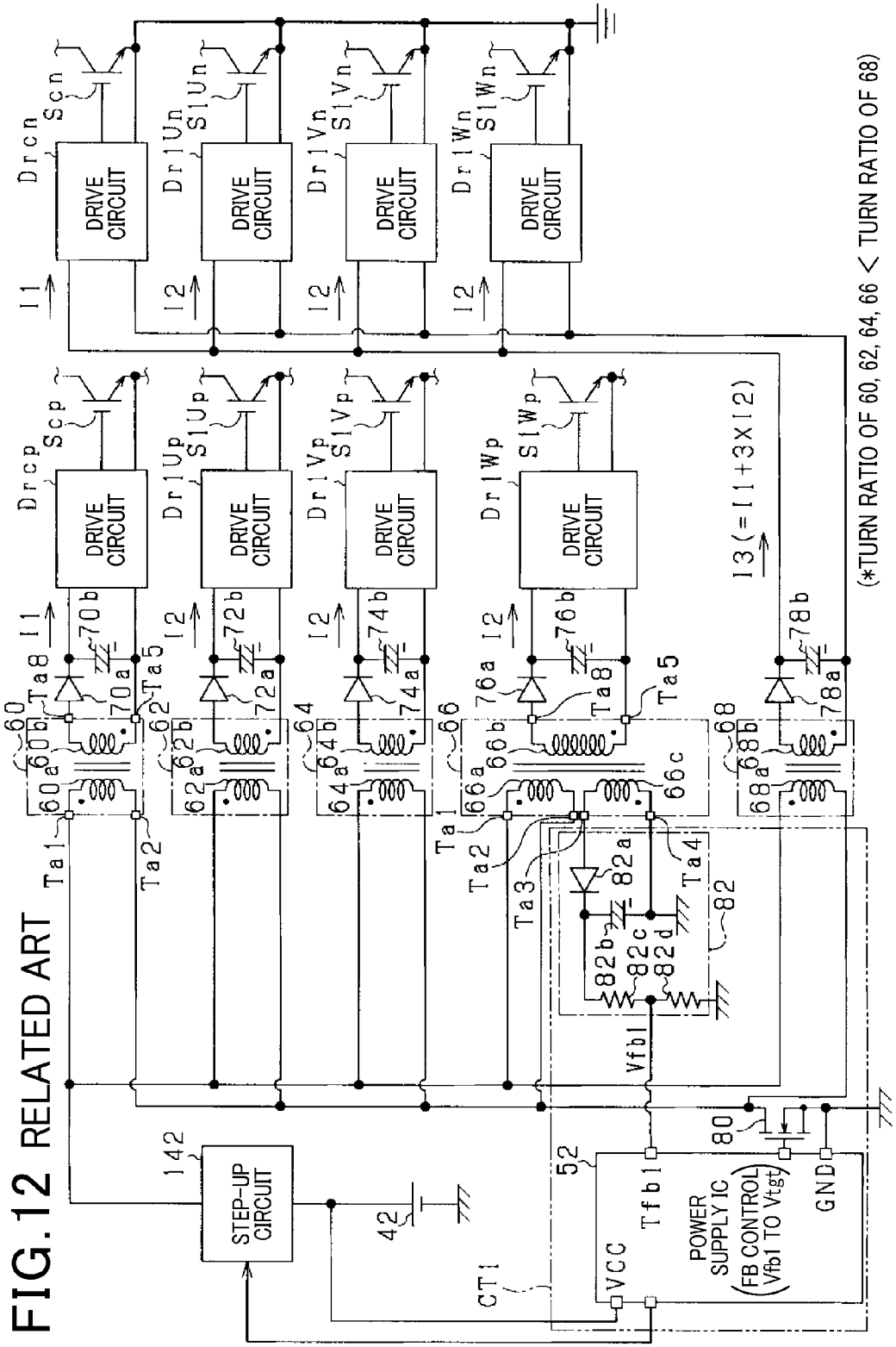
FIG. 12 is a diagram showing an insulated power supply apparatus according to a related art.

(4) The first to ninth primary side coils 60a, 62a, 64a, 66a, 68a, 90a, 92a, 94a, 96a and the low-voltage battery 42 are directly connected. The output voltage the low-voltage battery 42 easily varies. Hence, to suppress the variation of the applied voltage of the primary side coils, for example, as shown in FIG. 12, it can be considered to provide a chopper-type step-up circuit 142 to the insulated power supply apparatus, aiming to increase the accuracy in controlling the voltage applied from the low-voltage battery 42 to the primary side coils. Note that since the step-up circuit 142 produces heat when the step-up circuit 142 is operated, a concern rises that the heat adversely affects electronic components mounted on the substrate 150.

If employing the configuration which can obtain the advantage described in (1), even if the step-up circuit 142 is eliminated, the influence of eliminating the step-up circuit 142 can be considered to be supplemented with the advantages in that the accuracy in controlling the output voltage of the secondary side coils is enhanced and malfunctions of the first and second power supplies IC 52, 54 are avoided. Hence, in the configuration in which the first to ninth primary side coils 60a, 62a, 64a, 66a, 68a, 90a, 92a, 94a, 96a and the low-voltage battery 42 are directly connected, employing the configuration, in which the third transformer terminal Ta3 included in the fourth transformer 66 (eight transformer 94) and the first detection terminal Tfb1 (second detection terminal Tfb2) are connected by the first electric path Lfb1 (second electric path Lfb2), provides great advantages. Note that FIG. 12 corresponds to FIG. 4. In FIG. 12, the same part as that of FIG. 4 is denoted with the same reference numeral for the sake of convenience.

(5) If it is determined that the first feedback voltage Vfb1 (second feedback voltage Vfb2) has exceeded the specified voltage Vα, the first voltage control switching element 80 (second voltage control switching element 110) is forcibly turned off. Hence, reliability of the components of the insulated power supply apparatus, such as the switching elements Sc#, S1$#, S2$#, can be prevented from lowering.

(6) Only one first voltage control switching element 80 (second voltage control switching element 110) is provided which configures the first power supply control section CT1 (second power supply control section CT2). Hence, the number of terminals of the first power supply IC 52 (second power supply IC 54) can be reduces.

(7) Each of the primary side coils and the secondary side coils configuring the transformers is wound around the core 132 configuring the transformer via the bobbin 134 so as to be laminated. Specifically, in a case of the fourth transformer 66 (eighth transformer 94), each of the fourth primary side coil 66a, the fourth secondary side coil 66b, and the first feedback coil 66c configuring the fourth transformer 66 (the eighth primary side coil 94a, the eighth secondary side coil 94b, and the second feedback coil 94c configuring the eighth transformer 94) is wound around the core 132 via the bobbin 134 so as to be laminated. According to the above configuration, the following advantages can be obtained. Note that the advantages are described by taking as an example the insulated power supply apparatus whose main controller is the first power supply IC 52.

As charging current to be supplied to the gate of an IGBT increases, the output voltage of the secondary side coil decreases. This is because, as the charging current increase, the output current of the secondary side coil increases, thereby increasing the amount of voltage drop due to DC resistance and the like of the secondary side coil. Hence, the output voltage of each of the first to third and fifth secondary side coils 60b, 62b, 64b, 68b, which are not targets of voltage detection and configure the first to third and fifth transformers 60, 62, 64, 68 varies due to charging current.

In addition, as the coefficient of coupling between the fourth primary side coil 66a, the fourth secondary side coil 66b, and the first feedback coil 66 is lowered, the first feedback voltage Vfb1 is lowered with respect to the actual output voltage of the fourth secondary side coil 66b. In this case, in cooperation with the variation of the output voltage due to the charging current described above, variation of the output voltage of the first to third and five secondary side coils 60b, 62b, 64b, 68b with respect to the target voltage Vtgt becomes larger.

According to the above configuration, the coefficient of coupling between the fourth primary side coil 66a, the fourth secondary side coil 66b, and the first feedback coil 66 can be heightened. Hence, the variation of the output voltage of the first to third and fifth secondary side coils 60b, 62b, 64b, 68b with respect to the target voltage Vtgt can be smaller.

(8) The turn ratio of the fifth transformer 68 (ninth transformer 96) is set to be larger than those of the first to fourth transformers 60, 62, 64, 66 (sixth to eighth transformers 90, 92, 94). Hence, the variation of the output voltage of the first to fifth secondary side coils 60b, 62b, 64b, 66b, 68b (sixth to ninth secondary side coils 90b, 92b, 94b, 96b) can be smaller.

Second Embodiment

Hereinafter, the second embodiment is described focusing on differences from the first embodiment with reference to the drawings.

In the present embodiment, the position is changed where the second power supply control section CT2 is disposed on the substrate 150.

Figure 13:
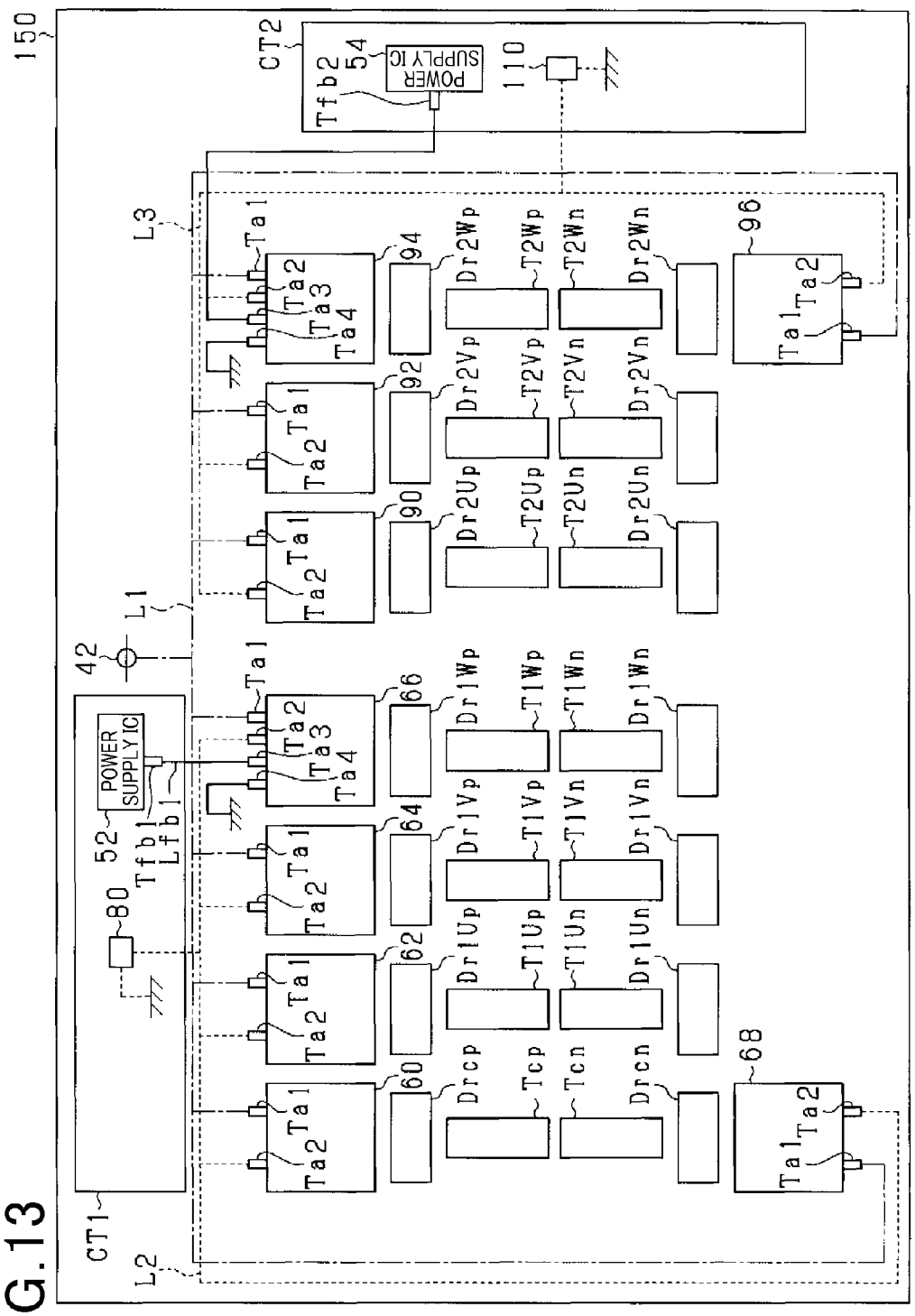
FIG. 13 is a plan view of a substrate according to a second embodiment.

FIG. 13 is a plan view of the substrate 150 according to the present embodiment. In FIG. 13, the same part as that of FIG. 10 is denoted with the same reference numeral for the sake of convenience. In addition, in the present embodiment, the first power supply control section CT1 corresponds to a "first target control section". The second power supply control section CT2 corresponds to a "second target control section".

As shown in FIG. 13, when viewing the first surface of the substrate 150 from the front thereof, the second power supply control section CT2 is provided in an area which is sandwiched between the eighth transformer 94, which is included in the sixth to eight transformers 90, 92, 94 corresponding to the second power supply control section CT2 and which is closest (among the sixth to eight transformers 90, 92, 94) to one side of the substrate 150 positioned in the direction in which the upper arm connection sections T2Up, T2Vp, T2Wp are arranged (in FIG. 13, the side at the right edge of the substrate 150, provided that the position of the low-voltage battery 42 is defined as the upper side of the substrate 150), and the one side. In addition, the second power supply control section CT2 is provided on the substrate 150 so as to be adjacent to the eighth transformer 94 and the ninth transformer 96.

In the present embodiment, of the eighth transformer 94 and the ninth transformer 96 which are provided so as to be adjacent to the second power supply control section CT2, the transformer whose distance to the second detection terminal Tfb2 of the second power supply IC 54 is the shortest, when viewing the first surface of the substrate 150 from the front thereof, is the eighth transformer 94. Hence, the third transformer terminal Ta3 of the eighth transformer 94 and the second detection terminal Tfb2 are connected by the second electric path Lfb2.

According to the above embodiment, advantages similar to those of the first embodiment can be obtained.

Third Embodiment

Hereinafter, the third embodiment is described focusing on differences from the second embodiment with reference to the drawings.

Figure 14:
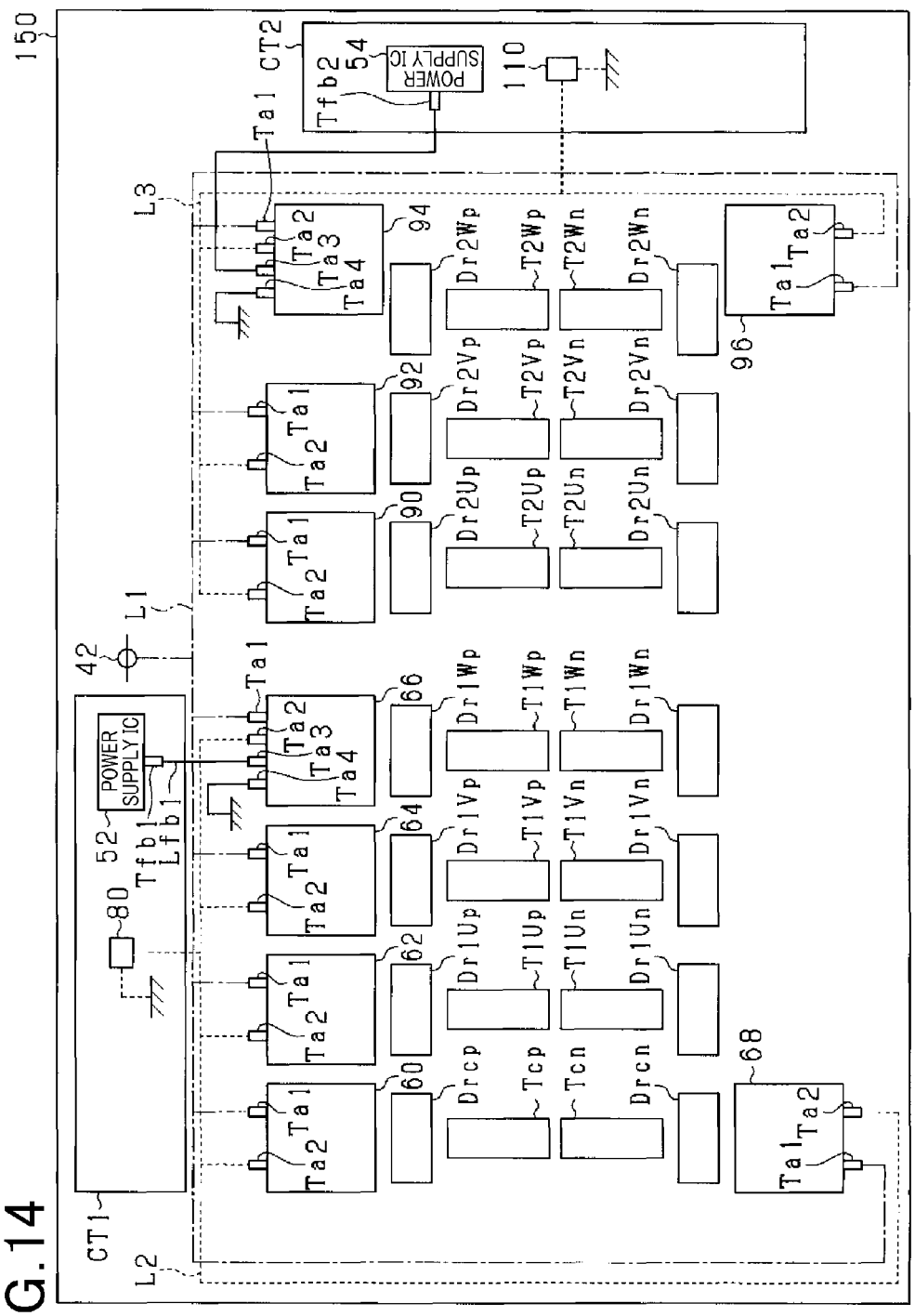
FIG. 14 is a plan view of a substrate according to a third embodiment.

In the present embodiment, as shown in FIG. 14, the positions on the substrate 150 where the eighth transformer 94 and the ninth transformer 96 are disposed are close to the second power supply control section CT2. FIG. 14 is a plan view of the substrate 150 according to the present embodiment. In FIG. 14, the same part as that of FIG. 13 is denoted with the same reference numeral for the sake of convenience.

According to the above embodiment, the second electric path Lfb2 of the present embodiment can be shorter than the second electric path Lfb2 of the second embodiment. Hence, accuracy in controlling the output voltage of the secondary side coil by the second power supply IC 54 can be further higher, and malfunctions of the second power supply IC 54 can be further prevented.

Fourth Embodiment

Hereinafter, the fourth embodiment is described focusing on differences from the first embodiment with reference to the drawings.

Figure 15:
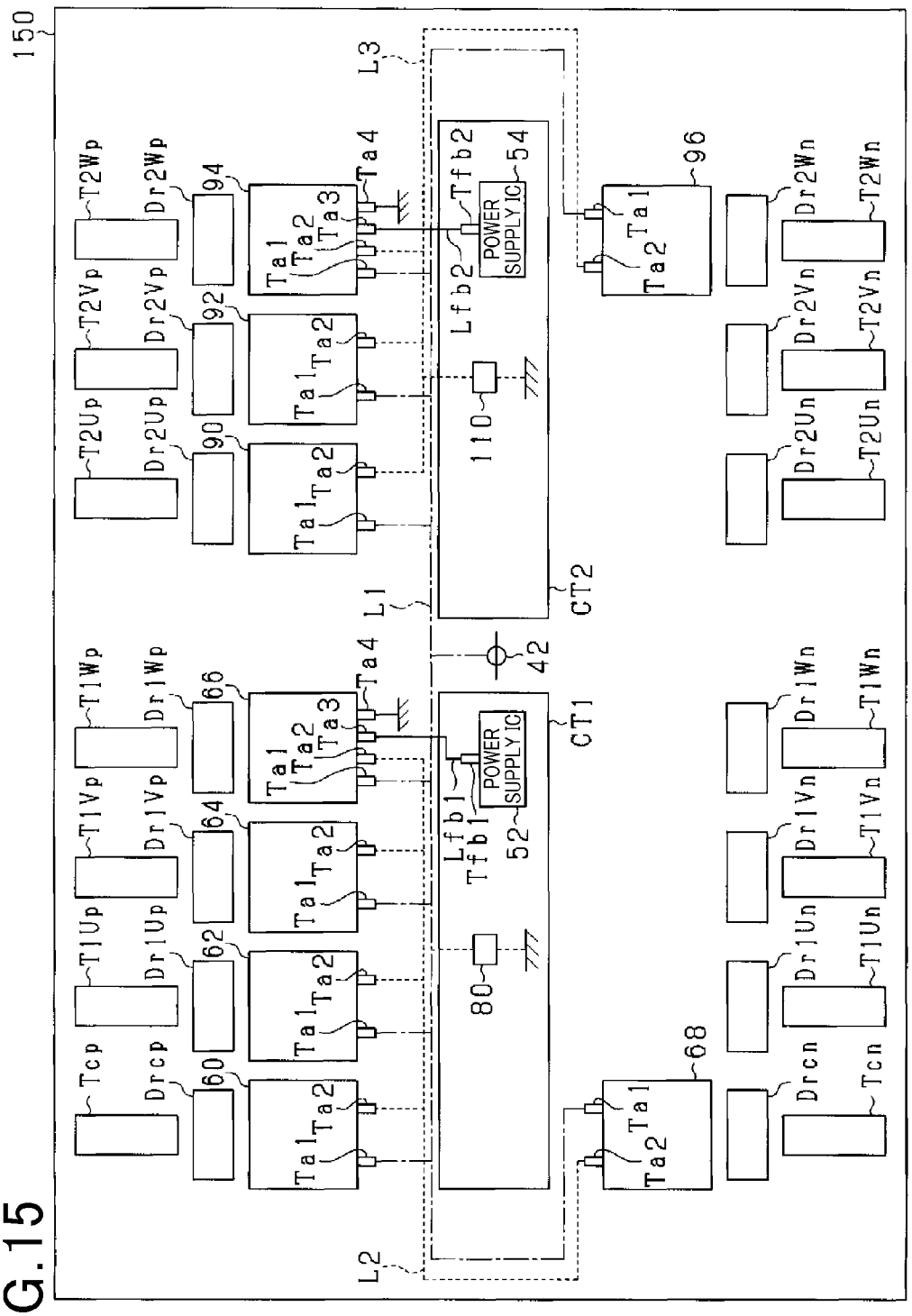
FIG. 15 is a plan view of a substrate according to a fourth embodiment.

In the present embodiment, the positions on the substrate 150 are changed where the transformers and the like are disposed FIG. 15 is a plan view of the substrate 150 according to the present embodiment. In FIG. 15, the same part as that of FIG. 10 is denoted with the same reference numeral for the sake of convenience. In addition, in the present embodiment, the insulated power supply apparatus whose main controller is the first power supply IC 52 and the insulated power supply apparatus whose main controller is the second power supply IC 54 have basically the same configuration. Hence, the present embodiment takes as an example the insulated power supply apparatus whose main controller is the first power supply IC 52.

As shown in FIG. 15, when viewing the first surface of the substrate 150 from the front thereof, the first power supply control section CT1 and the second power supply control section CT2 are arranged on the center portion of the substrate 150. In addition, when viewing the first surface of the substrate 150 from the front thereof, the upper arm connection sections Tcp, T1Up, T1Vp, T1Wp corresponding to the first power supply control section CT1 are arranged in line at an end of the substrate 150. In addition, when viewing the first surface of the substrate 150 from the front thereof, the lower arm connection sections Tcn, T1Un, T1Vn, T1Wn corresponding to first power supply control section CT1 are provided at an edge of the substrate 150 opposed to the upper arm connection sections Tcp, T1Up, T1Vp, T1Wp with respect to the first power supply control section CT1 so as to be arranged in line.

When viewing the first surface of the substrate 150 from the front thereof, the first to fourth transformers 60, 62, 64, 66 are provided in an area sandwiched between the first power supply control section CT1 and the upper arm connection sections Tcp, T1Up, T1Vp, T1Wp corresponding to the first power supply control section CT1, so as to be adjacent to the first power supply control section CT1, and in the direction in which the upper arm connection sections Tcp, T1Up, T1Vp, T1Wp corresponding to the first power supply control section CT1 are arranged, and so as to in line. The first to fourth transformers 60, 62, 64, 66 are provided so that the first transfer terminal Ta1 and the second transfer terminal Ta2 are adjacent to the first power supply control section CT1. Note that, in the sandwiched area, the upper arm drive circuits Drcp, Dr1Up, Dr1Vp, Dr1Wp corresponding to the first power supply control section CT1 are provided between the first to fourth transformers 60, 62, 64, 66 and the upper arm connection sections Tcp, T1Up, T1Vp, T1Wp corresponding to the first power supply control section CT1 and in the direction in which the upper arm connection sections Tcp, T1Up, T1Vp, T1Wp are arranged, so as to be in line. Note that the upper arm drive circuits Drcp, Dr1Up, Dr1Vp, Dr1Wp corresponding to the first power supply control section CT1 are provided in an area sandwiched between the first to fourth transformers 60, 62, 64, 66 and the upper arm connection sections Tcp, T1Up, T1Vp, T1Wp, and in the direction in which the upper arm connection sections Tcp, T1Up, T1Vp, T1Wp are arranged, so as to be in line.

When viewing the first surface of the substrate 150 from the front thereof, the fifth transformer 68 is provided in an area sandwiched between the first power supply control section CT1 and the step-up lower arm connection section Tcn. The lower arm step-up drive circuit Drcn is provided in an area sandwiched between the fifth transformer 68 and the step-up lower arm connection section Tcn. With reference to the position at which the lower arm step-up drive circuit Drcn is disposed, the lower arm drive circuits Drcn, Dr1Un, Dr1Vn, Dr1Wn corresponding to the first power supply control section CT1 are arranged in the direction in which the lower arm connection sections Tcn, T1Un, T1Vn, T1Wn are arranged, so as to be in line.

In the present embodiment, of the first to fifth transformers 60, 62, 64, 66, 68 provided so as to be adjacent to the first power supply control section CT1, the transformer whose distance to the first detection terminal Tfb1 of the first power supply IC 52 is the shortest, when viewing the first surface of the substrate 150 from the front thereof, is the fourth transformer 66. Hence, the third transformer terminal Ta3 of the fourth transformer 66 and the first detection terminal Tfb1 are connected by a first electric path Lfb1.

Note that, in the present embodiment, instead of the modules shown in FIG. 2 and FIG. 3, modules are used in which switching elements Sc$, S1$#, S2$# are individually included.

According to the above embodiment, advantages similar to those of the first embodiment can be obtained.

Fifth Embodiment

Hereinafter, the fifth embodiment is described focusing on differences from the first embodiment with reference to the drawings.

In the present embodiment, upper arm transformers of the first inverter 12 and the second inverter 22 have the same specification.

Figure 16:
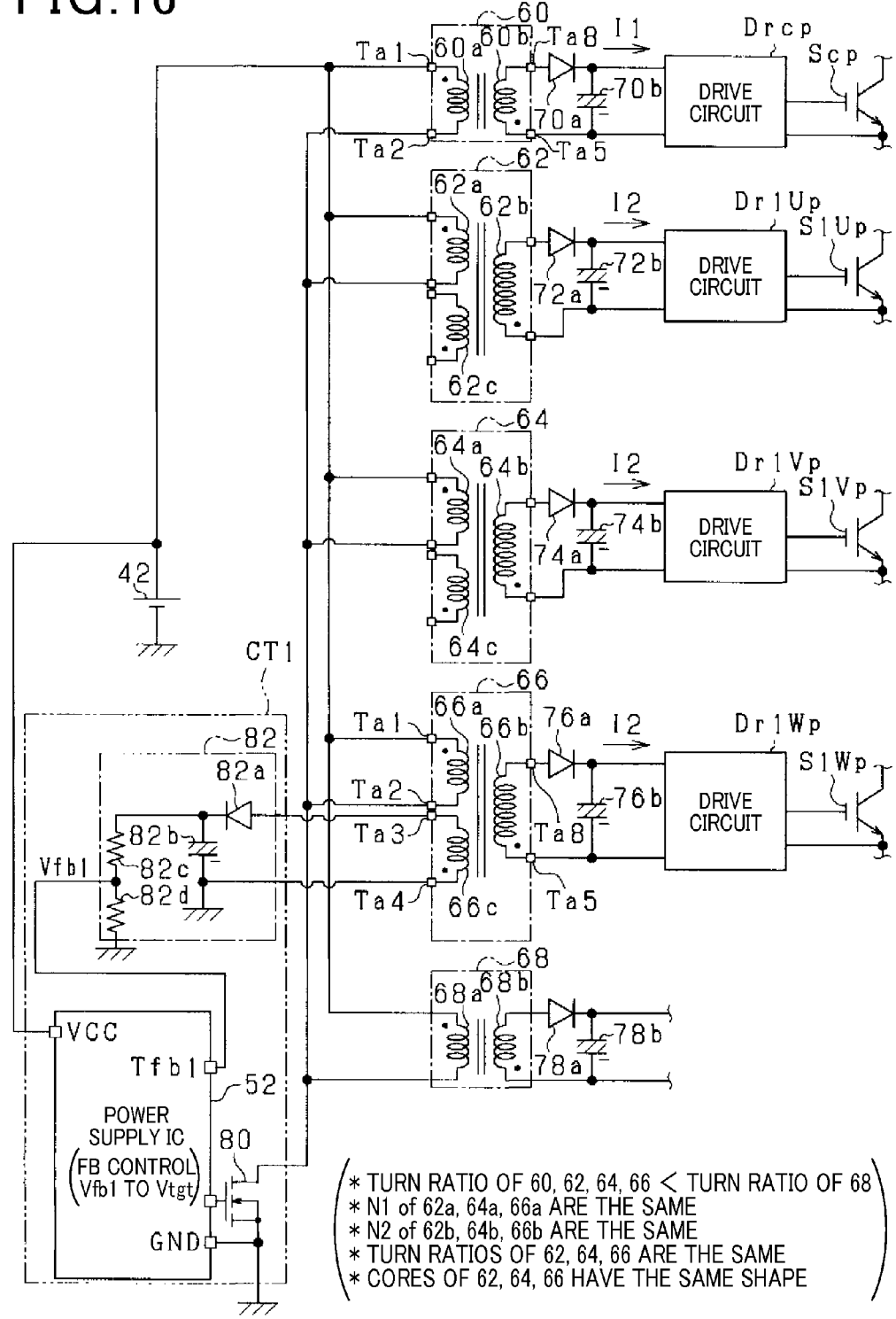
FIG. 16 is a diagram showing an insulated power supply apparatus according to a fifth embodiment.

FIG. 16 shows the insulated power supply apparatus in which the first power supply IC 52 is a main controller. In FIG. 16, the same part as that of FIG. 4 is denoted with the same reference numeral for the sake of convenience. In addition, in FIG. 16, the lower arm drive circuits Drcn, Dr1$n and the lower arm switching elements Scn, S1$n are not shown.

As shown in FIG. 16, in the present embodiment, transformers having the same specification (i.e. the same structure) as that of the fourth transformer 66 shown in FIGS. 7 to 9 are used as the second and third transformers 62, 64. Specifically, the number of turns N1 of the fourth primary side coil 66a configuring the fourth transformer 66 and the number of turns N1 of the second and third primary side coils 62a, 64a configuring the second and third transformers 62, 64 are the same. In addition, the number of turns N2 of the fourth secondary side coil 66a configuring the fourth transformer 66 and the number of turns N2 of the second and third secondary side coils 62a, 64a configuring the second and third transformers 62, 64 are the same. Hence, the turn ratio of the fourth transformer 66 and the turn ratio of the second and third transformers 62, 64 are the same.

In addition, the core configuring the fourth transformer 66, shown in FIG. 7, and the cores configuring the second and third transformers 62, 64 have the same shape. Note that, in FIG. 16, a feedback coil of the second transformer 62 is indicated by "62c", and a feedback coil of the third transformer 64 is indicated by "64c". In addition, in the present embodiment, transformer terminals connected to the feedback coils 62c, 64c are opened.

Note that, although not shown, also in the insulated power supply apparatus in which the second power supply IC 54 is a main controller, transformers having the same specification as that of the eighth transformer 94 are used as the sixth and seventh transformers 90, 92. Specifically, the number of turns N1 of the eighth primary side coil 94a configuring the eight transformer 94 and the number of turns N1 of the sixth and seventh primary side coils 90a, 92a configuring the sixth and seventh transformers 90, 92 are the same. In addition, the number of turns N2 of the eighth secondary side coil 94b configuring the eighth transformer 94 and the number of turns N2 of the sixth and seventh secondary side coils 90b, 92b configuring the sixth and seventh transformers 62, 64 are the same. Hence, the turn ratio of the eighth transformer 94 and the turn ratio of the sixth and seventh transformers 90, 92 are the same. In addition, the core configuring the eighth transformer 94 and the cores configuring the sixth and seventh transformers 90, 92 have the same shape.

According to the above embodiment, the specification of the transformers configuring the insulated power supply apparatus can be simplified. Hence, the manufacturing cost of the insulated power supply apparatus can be reduced.

Other Embodiments

It will be appreciated that the present invention is not limited to the configurations described above, but any and all modifications, variations or equivalents, which may occur to those who are skilled in the art, should be considered to fall within the scope of the present invention.

Figure 17:
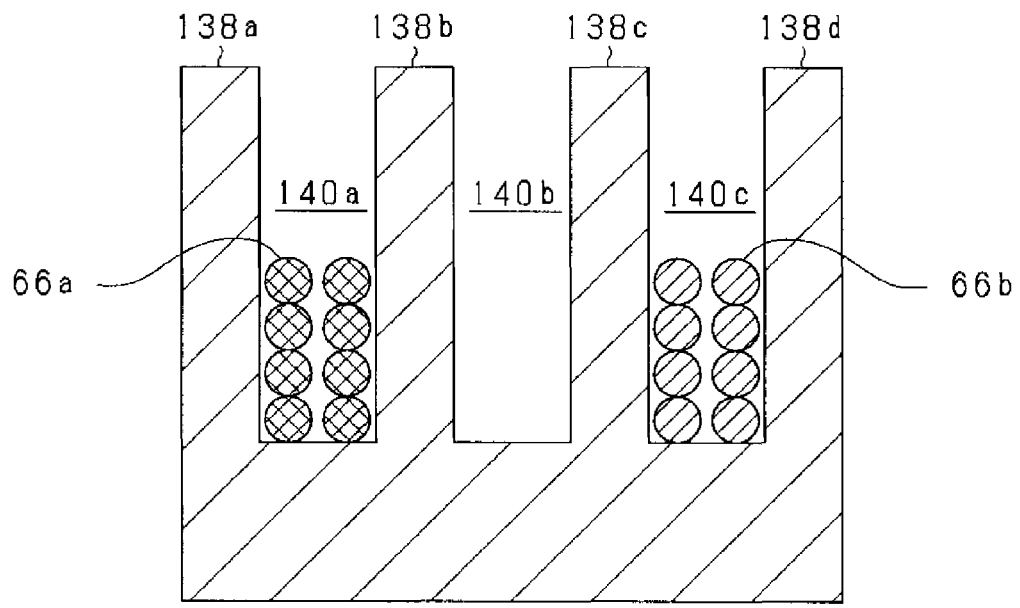
FIG. 17 is a sectional view cut along the line A-A of a circular portion according to another embodiment.

The way of winding the primary side coil and the secondary side coil around the bobbin 134 is not limited to that shown in FIG. 9. For example, as shown in FIG. 17, a sectional winding may be employed in which the fourth primary side coil 66a is wound around the first section 140a and the fourth secondary side coil 66b is wound around the third section 140c. In FIG. 17, coils are not wound around the second section 140b to ensure the insulation distance. In this case, the insulation film is not necessarily required to be applied to each of the coils. In FIG. 17, the same part as that of FIG. 9 is denoted with the same reference numeral for the sake of convenience.

The way of connecting the primary side coils, the secondary side coils, wiring patterns formed on the substrate 150 and the like to the first to eighth transformer terminals Ta1 to Ta8 is not limited to those shown in FIGS. 9 and 10. For example, the second wiring pattern L2 may be connected to the first transformer terminal Ta1, and the first wiring pattern L1 may be connected to the second transformer terminal Ta2.

According to the above embodiments, in the insulated power supply apparatus in which the first power supply IC 52 is a main controller, only the fourth transformer 66 includes a feedback coil. However, for example, all the first to fifth transformers 60, 62, 64, 66, 68 may include a feedback coil. Note that the insulated power supply apparatus in which the second power supply IC 54 is a main controller is in the similar manner.

According to the above embodiments, in the insulated power supply apparatus in which the first power supply IC 52 is a main controller, the fourth transformer 66 is connected the first power supply IC 52 by an electric path. However, for example, if the third transformer 64 is the transformer closest to the first detection terminal Tfb1 of the first power supply IC 52, the third transformer may include the third transformer terminal Ta3, which is connected to the first detection terminal Tfb1 by the first electric path Lfb1. In addition, the transformer connected by the electric path is not limited to an upper arm transformer, but may a lower arm transformer. Note that the insulated power supply apparatus in which the second power supply IC 54 is a main controller is in the similar manner.

In FIG. 16 of the fifth embodiment, in addition to the second to fourth transformers 62, 64, 66, the first transformer 60 may have the same specification. In this case, by setting the number of turns N1 of the primary side coil and the number of turns N2 of the secondary side coil configuring the first to fourth transformers 60, 62, 64, 66, the numbers of turns of the transformers 60, 62, 64, 66 may be the same. In addition, in FIG. 16 of the fifth embodiment, the second transformer 62 or the third transformer 63 may be the transformer having the same specification as that of the fourth transformer 66.

In addition, the first to fourth transformers 60, 62, 64, 66 do not necessarily have the same specification. For example, at least one of the group of the number of turns N1 of the primary side coil and the number of turns N2 of the secondary side coil, and the shapes of the cores may be the same. Specifically, for example, in the fifth embodiment, the first transformer 60 and the group of the second to fourth transformers 62, 64, 66 differ in the number of turns N1 of the primary side coil and the number of turns N2 of the secondary side coil. Thereby, the turn ratio the first transformer 60 is set to be higher than those of the second to fourth transformers 62, 64, 66. Hence, the shapes of the cores configuring the transformer 60, 62, 64, 66 may be the same.

The "lower arm transformer" is not limited to the transformer common to the plurality of lower arm switching elements configuring the power converter circuit. For example, as in the case of the upper arm transformer, the lower arm transformers may be provided so as to individually correspond to the plurality of the lower arm switching elements. In this case, for example, in FIG. 16, all the upper and lower arm transformers may have the same specification.

In the above embodiments, the primary side coils configuring the upper arm transformer and the lower arm transformer may be directly connected.

In the first embodiment, the number of turns of the fifth secondary side coil 68b and the number of turns of the first feedback coil 68c are set to be the same. However, the numbers of turns may be set to be different from each other. In this case, the first feedback coil 68c outputs the voltage corresponding to the output voltage of the fifth secondary side coil 68b. Note that the number of turns of the eighth secondary side coil 94b and the number of turns of the second feedback coil 94c are set in the similar manner.

When viewing the first surface of the substrate 150 from the front thereof, the orders, in which the upper arm connection sections Tcp, T1Up, T1Vp, T1Wp, T2Up, T2Vp, T2Wp are arranged and the lower arm connection sections Tcn, T1Un, T1Vn, T1Wn, T2Un, T2Vn, T2Wn are arranged, are not limited to those shown in FIG. 10.

In the above embodiments, the step-up circuit 142 shown in FIG. 12 may be provided between the low-voltage battery 42 and the primary side coils.

When viewing the surface of the substrate from the front thereof, the electric path may be connected to the transformer which is one of the transformers provided so as to be adjacent to the power supply control section and which is other than the transformer whose distance to the detection terminal is the shortest. Even in this case, the electric path connected to the detection terminal can be shortened.

The "output section" is not limited to the voltage detection coil. For example, in FIG. 4, the output section may be a means for transferring the voltage across the terminals of the fourth capacitor 76b or the voltage depending on the voltage across the terminals to the first power supply IC 52 while electrically insulating the high-voltage system from the low-voltage system. Such a means is, for example, a photocoupler which transmits a PWN signal associated with the voltage across the terminals to the first power supply IC 52.

In the above embodiments, the step-up converter 30 can be eliminated from the motor control system shown in FIG. 1.

The motor control system is not limited to a two-motors control system but may be a one-motor control system. In this case, one of the group of the first motor generator 10 and the first inverter 12 and the group of the second motor generator 20 and the second inverter 22, and the step-up converter 30 is eliminated from the motor control system shown in FIG. 1.

The "insulated power supply apparatus" is not limited to a flyback converter shown in FIG. 4 or 5, but may be, for example, a forward converter. In addition, the insulated power supply apparatus is not limited to the converter including one voltage control switching element but may be a full-bridge converter including four voltage control switching elements or a push-pull converter including two voltage control switching elements. Note that the full-bridge converter and the push-pull converter are disclosed in, for example, "Dengen Kairo Sekkei Seiko No Kagi, 4th Ed. by Seitaro Baba, CQ Publishing Co., Ltd, 2012, Feb. 1, 2012, p. 141".

The "power converter circuit" is not limited to a step-up converter and a three-phase inverter. For example, the power converter circuit may be another type of circuit such as a half-bridge circuit and a full-bridge circuit. In addition, the "upper arm switching element" and the "lower arm switching element" configuring the power converter circuit are not limited to IGBTs but may be MOSFETs.

Hereinafter, aspects of the above-described embodiments will be summarized.

As an aspect of the embodiment, an insulated power supply apparatus, which is applied to at least one power converter circuit (12, 22, 30) including at least one series connection of an upper arm switching element (Scp, S1$p, S2$p) and a lower arm switching element (Scn, S1$n, S2$n), includes: at least one upper arm transformers (60, 62, 64, 66, 90, 92, 94) which has a primary side coil (60a, 62a, 64a, 66a, 90a, 92a, 94a) connectable to a DC power supply (42) and a secondary side coil (60b, 62b, 64b, 66b, 90b, 92b, 94b) which supplies drive voltage to the upper arm switching element, and which is provided on a substrate (150); a lower arm transformer (68, 96) which has a primary side coil (68a, 96a) connectable to the DC power supply and a secondary side coil (68b, 96b) which supplies drive voltage to the lower arm switching element, and which is provided on the substrate (150); and at least one power supply control section (CT1, CT2) which has at least one voltage control switching element (80, 110) which is turned on or off to apply voltage of the DC power supply to the primary side coils of the upper arm transformer and the lower arm transformer, and an integrated circuit (52, 54) which turns on or off the voltage control switching element, and which is provided on the substrate. At least one of the upper arm transformer and the lower arm transformer is provided so as to be adjacent to the power supply control section when viewing a surface of the substrate from a front thereof. The apparatus further includes an electric path (Lfb1, Lfb2) which transfers output voltage of the secondary side coil (66b, 94b) of the transformer (66, 94) provided so as to be adjacent to the power supply control section, to the integrated circuit. The integrated circuit turns on or off the voltage control switching element to perform feedback control so that the output voltage detected via the electric path reaches a target voltage.

In the above embodiment, at least one of the upper arm transformer and the lower arm transformer is provided so as to be adjacent to the power supply control section when viewing the surface of the substrate from the front thereof. Hence, the electric path can be shortened which transfers the output voltage of the secondary side coil configuring the transformer arranged so as to be adjacent to the power supply control section to the integrated circuit as controlled variables of feedback control. Hence, the amount of voltage drop in the electric path can be decreased, and superimposition of noise on the voltage signal transferred to the electric path can be suppressed. Therefore, accuracy in controlling output voltage of the secondary side coil by the integrated circuit can be enhanced, and a malfunction of the integrated circuit can be avoided.

What is claimed is:

1. An insulated power supply apparatus, which is applied to at least one power converter circuit including a plurality of series connections of an upper arm switching element and a lower arm switching element, comprising:

upper arm transformers which have a primary side coil connectable to a DC power supply and a secondary side coil which supplies drive voltage to the upper arm switching element, and which are provided on a substrate so as to individually correspond to the upper arm switching elements;

a lower arm transformer which has a primary side coil connectable to the DC power supply and a secondary side coil which supplies drive voltage to the lower arm switching element, and which is provided on the substrate; and at least one power supply control section which has at least one voltage control switching element which is turned on or off to apply voltage of the DC power supply to the primary side coils of the upper arm transformers and the lower arm transformer, and an integrated circuit which turns on or off the voltage control switching element, and which is provided on the substrate, wherein at least one of the upper arm transformers is provided so as to be adjacent to the power supply control section when viewing a surface of the substrate from a front thereof, the apparatus further comprises an electric path which connects a detection terminal of the integrated circuit and an output section for output voltage of the secondary side coil included in the transformer, which is included in the upper arm transformers and is provided so as to be adjacent to the power supply control section and whose distance to the detection terminal is the shortest when viewing the surface of the substrate from the front thereof, and the integrated circuit turns on or off the voltage control switching element to perform feedback control so that the output voltage detected via the electric path reaches a target voltage.

2. The insulated power supply apparatus according to claim 1, wherein the power converter circuit includes a parallel connection of the series connections, the apparatus further comprises:

a plurality of upper arm connection sections which connect the upper arm switching elements to the substrate and which are provided on the substrate so as to be arranged in line, when viewing the surface of the substrate from the front thereof; and a plurality of lower arm connection sections which connect the lower arm switching elements to the substrate and which are provided on the substrate so as to be arranged in line and in a direction in which the upper arm connection sections are arranged, when viewing the surface of the substrate from the front thereof.

3. The insulated power supply apparatus according to claim 2, wherein the power supply control sections are provided so as to individually correspond to groups of the power converter circuits, the upper arm connection sections are provided on the substrate so as to adjacent to the lower arm connection sections when viewing the surface of the substrate from the front thereof, a first target control section which is at least one of the power supply control sections is provided at a side opposed to the lower arm connection sections corresponding to the first target control section with respect to the upper arm connection sections corresponding to the first target control section, when viewing the surface of the substrate from the front thereof, and the upper arm transformers corresponding to the first target control section are provided, in an area sandwiched between the first target control section and the upper arm connection sections corresponding to the first target control section, so as to be adjacent to the first target control section, and in a direction in which the upper arm connection sections corresponding to the first target control section are arranged, and so as to be in line, when viewing the surface of the substrate from the front thereof.

4. The insulated power supply apparatus according to claim 2, wherein the power supply control sections are provided so as to individually correspond to groups of the power converter circuits, the upper arm connection sections are provided on the substrate so as to be adjacent to the lower arm connection sections, when viewing the surface of the substrate from the front thereof, the upper arm transformers corresponding to a second target control section which is at least one of the power supply control sections are provided, in a direction in which the upper arm connection sections corresponding to the second target control section are arranged, so as to be in line, when viewing the surface of the substrate from the front thereof, and the second target control section is provided in an area which is sandwiched between the transformer, which is included in the upper arm transformers corresponding to the second target control section and which is closest to one side of the substrate positioned in a direction in which the upper arm connection sections are arranged, and the one side, when viewing the surface of the substrate from the front thereof.

5. The insulated power supply apparatus according to claim 1, wherein the primary side coils configuring the upper arm transformers and the lower arm transformer are connected in parallel.

6. The insulated power supply apparatus according to claim 1, wherein the DC power supply is a storage battery.

7. The insulated power supply apparatus according to claim 1, wherein the integrated circuit includes a forced operation means which, if the output voltage detected via the electric path exceeds a specified voltage, operates the voltage control switching element so as to forcibly stop supplying voltage from the DC power supply to the primary side coils configuring the upper arm transformers and the lower arm transformer.

8. The insulated power supply apparatus according to claim 1, wherein the primary side coils configuring the upper arm transformers and the lower arm transformer are connected in parallel, the voltage control switching element is provided so as to form a closed circuit including the DC power supply, the parallel connection of the primary side coils, and the voltage control switching element, when the voltage control switching element is turned on.

9. The insulated power supply apparatus according to claim 1, wherein each of the primary side coils and the secondary side coils configuring the upper arm transformer and the lower arm transformers are provided with an insulation film, each of the primary side coils and the secondary side coils is wound around a bobbin attached to a core configuring each of the upper arm transformer and the lower arm transformer, so as to be laminated.

10. The insulated power supply apparatus according to claim 1, wherein the lower arm transformer is common to the lower arm switching elements and includes the common secondary side coil which applies the drive voltage to the lower arm switching elements, and a turn ratio of the secondary side coil to the primary side coil configuring the lower arm transformer is larger than a turn ratio of the secondary side coil to the primary side coil configuring the upper arm transformer.

11. The insulated power supply apparatus according to claim 1, wherein
the core configuring the transformer which is a target of detection of output voltage via the electric path and is included in the upper arm transformers, and the core configuring at least one of the other upper arm transformers have the same shape.

12. The insulated power supply apparatus according to claim 11, wherein
the number of turns of the primary side coil configuring the transformer which is the target of detection and the number of turns of the primary side coil configuring the at least one of the other transformers are the same, and
the number of turns of the secondary side coil configuring the transformer which is the target of detection and the number of turns of the secondary side coil configuring the at least one of the other transformers are the same.

13. The insulated power supply apparatus according to claim 11, wherein
a turn ratio of the secondary side coil to the primary side coil configuring the transformer which is the target of detection and a turn ratio of the secondary side coil to the primary side coil configuring the at least one of the other transformer are the same.

14. The insulated power supply apparatus according to claim 11, wherein
the power converter circuit includes an inverter having the parallel connection of the series connections,
the lower arm transformer is common to the lower arm switching elements and includes the common secondary side coil which applies drive voltage to the lower arm switching elements, and
the cores configuring the upper arm transformers of the inverter have the same shape.

15. The insulated power supply apparatus according to claim 14, wherein
the number of turns of the primary side coils configuring the upper arm transformers of the inverter are the same, and
the number of turns of the secondary side coils configuring the upper arm transformers of the inverter are the same.

16. The insulated power supply apparatus according to claim 14, wherein
turn ratios of the secondary side coils to the primary side coils configuring the upper arm transformers of the inverter are the same.

17. The insulated power supply apparatus according to claim 1, wherein
the detection terminal is provided to the integrated circuit so as to be directed toward the transformer whose distance to the detection terminal is the shortest, and
the output section is provided to the transformer whose distance to the detection terminal is the shortest, so as to be directed toward the integrated circuit.

18. The insulated power supply apparatus according to claim 17, wherein
the transformer to which the electric path is connected includes, as the output section, a voltage detection coil which outputs output voltage of the secondary side coil of the transformer or voltage corresponding to the output voltage,
the apparatus further comprises a feedback circuit which is provided so as to correspond to only the transformer which is one of the upper arm transformers and to which the electric path is connected, and which converts AC voltage outputted from the voltage detection coil to DC voltage, and
the electric path is a path from a terminal of the voltage detection coil to the detection terminal via the feedback circuit.

* * * * *